US012707819B2

(12) United States Patent
Cho et al.

(10) Patent No.: US 12,707,819 B2
(45) Date of Patent: Aug. 11, 2026

(54) DISPLAY PANEL AND ELECTRONIC DEVICE INCLUDING THE SAME

(71) Applicant: Samsung Display Co., Ltd., Yongin-si (KR)

(72) Inventors: Hyeri Cho, Asan-si (KR); Jinsung An, Gwacheon-si (KR); Minwoo Woo, Seoul (KR); Seunghyun Lee, Asan-si (KR); Wangwoo Lee, Osan-si (KR); Kyeongwoo Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 666 days.

(21) Appl. No.: 18/070,980

(22) Filed: Nov. 29, 2022

(65) Prior Publication Data

US 2023/0263011 A1 Aug. 17, 2023

(30) Foreign Application Priority Data

Feb. 14, 2022 (KR) ........................ 10-2022-0019110

(51) Int. Cl.
*H10K 59/122* (2023.01)

(52) U.S. Cl.
CPC ................................. *H10K 59/122* (2023.02)

(58) Field of Classification Search
CPC .... H10K 59/122; H10K 59/40; H10K 59/123; H10K 59/121; H10K 59/65; H10K 59/124; H10K 59/131; H10K 50/805; H10K 59/00; H10D 86/411; H10D 86/0212; H10D 86/441; H10D 86/60; G09F 9/33; G09F 9/335
See application file for complete search history.

(56) References Cited

U.S. PATENT DOCUMENTS

| | | | | |
|---|---|---|---|---|
| 11,296,159 B2 | | 4/2022 | Choi et al. | |
| 11,730,010 B2 | | 8/2023 | Lee et al. | |
| 11,751,463 B2 | | 9/2023 | Choi et al. | |
| 12,127,440 B2 | | 10/2024 | Choi et al. | |
| 2017/0373124 A1* | | 12/2017 | Yang .................... | H10K 59/879 |
| 2019/0172873 A1* | | 6/2019 | Ji ......................... | H10K 59/121 |
| 2020/0203667 A1* | | 6/2020 | Youn .................... | H10K 59/875 |
| 2020/0365664 A1 | | 11/2020 | Jeon et al. | |

(Continued)

FOREIGN PATENT DOCUMENTS

| | | |
|---|---|---|
| CN | 107688254 B | 5/2020 |
| CN | 112767870 A | 5/2021 |

(Continued)

*Primary Examiner* — Kevin Quarterman
(74) *Attorney, Agent, or Firm* — CANTOR COLBURN LLP

(57) ABSTRACT

A display panel includes: a base layer including a first region, a circuit layer including a first intermediate insulation layer disposed on the base layer and a compensation layer disposed on the base layer, a light emission element layer including a first light emission element having a first electrode and disposed in the first region, and disposed on the circuit layer, and a first spacer disposed on the circuit layer, and overlapping the compensation layer in a plan view. The first region includes an element region overlapping the first electrode and a transmission region not overlapping the first electrode, and the first spacer and the compensation layer are each disposed in the transmission region.

15 Claims, 14 Drawing Sheets

(56) References Cited

U.S. PATENT DOCUMENTS

| | | | | |
|---|---|---|---|---|
| 2021/0066410 | A1* | 3/2021 | Jo | H10K 59/40 |
| 2021/0111230 | A1* | 4/2021 | Shin | H10K 77/111 |
| 2022/0020834 | A1* | 1/2022 | Chun | H10K 59/879 |

FOREIGN PATENT DOCUMENTS

| | | | |
|---|---|---|---|
| KR | 1020050089683 | A | 9/2005 |
| KR | 1020200119946 | A | 10/2020 |
| KR | 1020200131400 | A | 11/2020 |
| KR | 1020210016230 | A | 2/2021 |
| KR | 1020210028319 | A | 3/2021 |
| KR | 1020210081572 | A | 7/2021 |

* cited by examiner

DD

300

200

110 120 130 140

100

DR3

DR1

DR2

AA'
PXL1
SPC1
PXL2
PXL3
PXL4
PXL5
PXL6
LD1
PX1
TWL
PC1
DP-A1
PC2
PX2
LD2
DP-A2
PC3
PX3
LD3
DP-A3
SPC3
DR1
DR2
DR3

DD
100
300
200
140
130
120
330
310-OP1
322
310
240
230
220
210
143
142
141
SPC3-2
PDL
80
60
50
40
30
20
10
10br
110
PDL-OP1
LD2
AE2 EL2 CE
CNE2
CNE1
PC2
BMLa
DP-A2
CNE4 DL
CNE3
PC1
BMLa
SPC1 CML
HH
TA
TWL
DP-A1
LD1
AE1 EL1 CE
CNE
EA
PDP-OP
TA'
321
SPC2
PDP
DR3

DD
100
300
330
200
230
210
140
143
142
Hd
SPC1
CML
141
120
80
60
50
40
30
20
10
10br
110
HBO-1
HBO-2
MH1
HH
TA
DP-A1
EA
PDP
LD1
CE
EL1
AE1
PDP-OP
321
CNE'
TWL
SPC2
SPC3-2
240
PDL-OP2
CNE2
CNE1
CE20
CE10
Cst
SE1
GT1
AC1
DE1
S-TFT
BMLa
BMLb
DP-A3
LD3
AE3
EL3
SE2
AC2
DE2
GT2
O-TFT
310-OP2
BML2-C
323
310
220
SPC3
130
PDL
70
MH3
PC3
DR3

DD
100
300
200
140
120
330
230
210
143
142
Hd
SPC1
141
80
CML
60
50
40
30
20
10
10br
110
H60-1
HH
H60-2
TA
DP-A1
EA
PDP
LD1
CE
EL1
AE1
PDP-OP
321
SPC2
CNE
TWL
SPC3-2
240
PDL-OP
LD3
EL3
AE3
310-OP2
323
310
220
SPC3
130
PDL
70
PC3
DR3
CNE2
CNE1
BML2-C
CE20
CE10
Cst
SE1
GT1
AC1
DE1
S-TFT
BMLa
BMLb
SE2
AC2
DE2
GT2
O-TFT
DP-A3

DD
310-OP2
LD3
AE3 EL3 CE
PDL-OP2
240
SPC3-2
PDP-OP
LD1
321
AE1 EL1 CE
PDP
323
310
220
SPC3
130
PDL
70
PC3
H70
BML2-C
CNE2
CNE1
SPC2
CNE'
TWL
330
300
230
200
210
143
142
Hd
140
SPC1
141
80
CML
HH
60
100
50
40
120
30
20
10
10br
110
DR3
GT2 DE2 AC2 SE2 BMLb BMLa DE1 AC1 GT1 SE1 CE10 CE20
O-TFT
S-TFT
Cst
DP-A3
TA
EA
TA
DP-A1

DD
100
200
140
130
120
230
210
143
142
141
80
70
60
50
40
30
20
10
10br
110
II'
II
DR3
DR1
DR2
240
220
EL3
AL3
PDL
CE
LD3
100A
100N
SL-1
SL-2
SPC3
H80-2
CNE2
CNE1
DE1
AC1
GT1
SE1
S-TFT
BMLa
L1
L2
L0
DAM1
DAM2
DAM3
DAM
dd1
dd3
H80-1
60
80
WOP2
OP2
WOP1
PW
BA
OP1
SPC4
PDL
70
LN2
230
210
P3-1
P2-1
PD

DISPLAY PANEL AND ELECTRONIC DEVICE INCLUDING THE SAME

This application claims priority to Korean Patent Application No. 10-2022-0019110, filed on Feb. 14, 2022, and all the benefits accruing therefrom under 35 U.S.C. § 119, the content of which in its entirety is herein incorporated by reference.

BACKGROUND

The present disclosure herein relates to a display panel including a display region through which an optical signal transmits and an electronic device including the display panel.

An electronic device may include various electronic components such as a display panel and an electronic module. The electronic module may include a camera, an infrared sensing sensor, a proximity sensor, or the like. The electronic module may be disposed below the display panel. The light transmittance of some regions of the display panel may be higher than the light transmittance of the other regions of the display panel. The electronic module may receive an optical signal, or transmit an optical signal through a region having high light transmittance.

For example, the electronic module may be a camera module, a sensor, such as a proximity sensor, for measuring the distance between an object and a cellphone, a sensor for recognizing a part of a user's body (e.g., a fingerprint, iris, or face), or the like. The operation of the electronic module may be affected by a structure inside the display panel. Studies on internal structures of a display panel are continuously conducted in order to improve the reliability of the electronic module.

SUMMARY

The present disclosure provides a display panel with less shrinkage failure by reducing the thickness of an insulation layer.

The present disclosure also provides an electronic device in which the transmittance of light is increased in a transmission region.

An embodiment of the invention provides a display panel including: a base layer including a first region, a circuit layer including a first intermediate insulation layer disposed on the base layer and a compensation layer disposed on the base layer, a light emission element layer including a first light emission element having a first electrode and disposed in the first region, and disposed on the circuit layer, and a first spacer disposed on the circuit layer, and overlapping the compensation layer in a plan view, where the first region includes an element region overlapping the first electrode and a transmission region not overlapping the first electrode, and the first spacer and the compensation layer are each disposed in the transmission region.

In an embodiment, the compensation layer may include the same material as a material of the first intermediate insulation layer, and may be disposed between the first intermediate insulation layer and the first spacer.

In an embodiment, a thickness of the compensation layer may substantially be the same as a thickness of the first intermediate insulation layer.

In an embodiment, in the plan view, the first intermediate insulation layer may overlap the transmission region.

In an embodiment, the circuit layer may further include a second intermediate insulation layer disposed between the base layer and the first intermediate insulation layer, and the compensation layer may include the same material as a material of the second intermediate insulation layer, and may be spaced apart from the second intermediate insulation layer and disposed in the same layer as the second intermediate insulation layer.

In an embodiment, a thickness of the compensation layer may substantially be the same as a thickness of the second intermediate insulation layer.

In an embodiment, the circuit layer may further include a third intermediate insulation layer disposed between the base layer and the first intermediate insulation layer, and the compensation layer may include the same material as a material of the third intermediate insulation layer, and may be disposed between the first intermediate insulation layer and the third intermediate insulation layer.

In an embodiment, a thickness of the compensation layer may substantially be the same as the thickness of the third intermediate insulation layer.

In an embodiment, a first spacer may be in contact with the circuit layer.

In an embodiment, the compensation layer may not overlap at least a portion of the transmission region in the plan view.

In an embodiment, the light emission element layer may further include a pixel definition pattern which exposes at least a portion of the first electrode, where the pixel definition pattern may overlap the element region in the plan view.

In an embodiment, the display panel may further include a second spacer disposed on the pixel definition pattern, where a thickness of the second spacer may be less than a thickness of the first spacer.

In an embodiment, the base layer may further include a second region adjacent to the first region, the light emission element layer may further include a second light emission element including a second light emission layer and disposed in the second region, and the circuit layer may further include a first pixel circuit electrically connected to the first light emission element and a second pixel circuit electrically connected to the second light emission element, where the first pixel circuit and the second pixel circuit may be disposed in the second region.

In an embodiment, the base layer may further include a third region adjacent to the second region, the light emission element layer may further include a third light emission element including a third light emission layer and disposed in the third region, and the circuit layer may further include a third pixel circuit electrically connected to the third light emission element and disposed in the third region.

In an embodiment, the light emission element layer may further include a pixel definition film surrounding the third light emission layer, where a third spacer may be disposed on the pixel definition film, and a maximum height of the third spacer from the base layer may be greater than a maximum height of the first spacer from the base layer.

In an embodiment, a thickness of the first intermediate insulation layer may be constant in the second region and in the third region.

In an embodiment of the invention, an electronic device includes an electronic module and a display panel disposed on the electronic module, where the display panel includes a base layer including a first region overlapping the electronic module, a circuit layer including a first intermediate insulation layer disposed on the base layer, a light emission element layer including a first light emission element having a first electrode and disposed in the first region, and disposed on the circuit layer, and a first spacer disposed on the circuit layer, where the first region includes an element region overlapping the first electrode, and a transmission region through which an optical signal transmitted from the electronic module or to be received by the electronic module passes, the first intermediate insulation layer has a maximum first thickness in a portion not overlapping the first spacer, and a maximum second thickness in a portion overlapping the first spacer in a plan view, and the maximum second thickness is greater than the maximum first thickness.

In an embodiment, the base layer may further include a second region adjacent to the first region and not overlapping the electronic module, and a third region adjacent to the second region and not overlapping the electronic module in the plan view, the light emission element layer may further include a second light emission element disposed in the second region and a third light emission element disposed in the third region, the circuit layer may further include a first pixel circuit electrically connected to the first light emission element and disposed in the second region, a second pixel circuit electrically connected to the second light emission element and disposed in the second region, and a third pixel circuit electrically connected to the third light emission element and disposed in the third region, and the first intermediate insulation layer may have the maximum first thickness in the first region and in the second region.

In an embodiment, the maximum second thickness may be about 1.5 times to about 2.5 times the maximum first thickness.

In an embodiment, the first spacer may be in contact with the first intermediate insulation layer.

BRIEF DESCRIPTION OF THE FIGURES

The accompanying drawings are included to provide a further understanding of the invention, and are incorporated in and constitute a part of this specification. The drawings illustrate exemplary embodiments of the invention and, together with the description, serve to explain principles of the invention. In the drawings.

DETAILED DESCRIPTION

Figure 1:
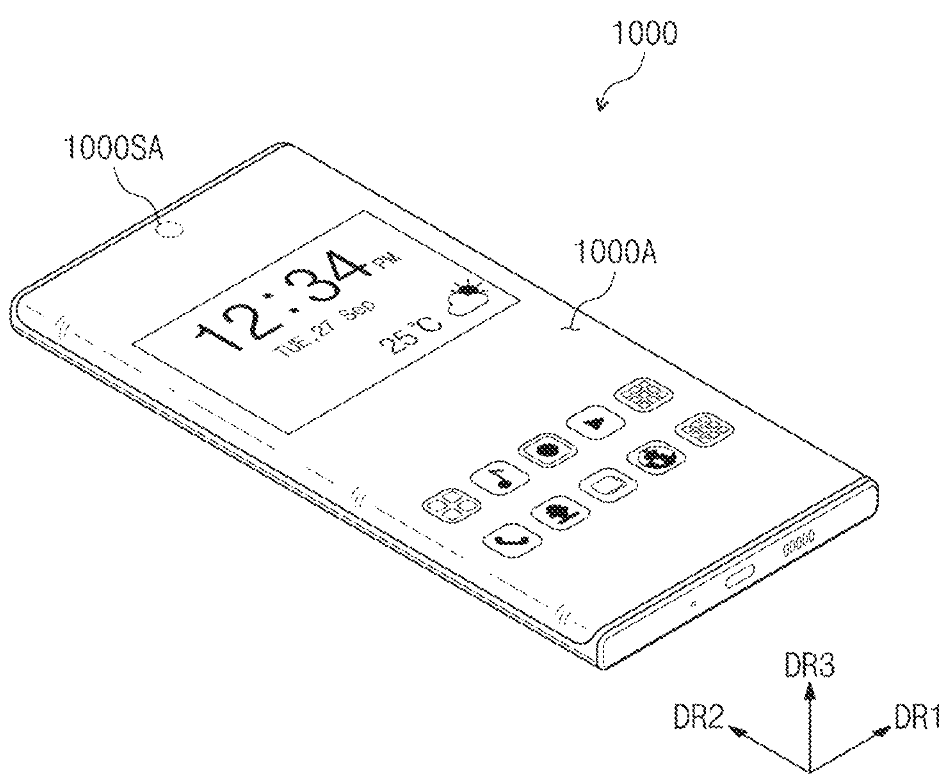
FIG. 1 is a perspective view of an electronic device according to an embodiment of the invention.

In the present disclosure, when an element (or a region, a layer, a portion, and the like) is referred to as being "on," "connected to," or "coupled to" another element, it means that the element may be directly disposed on/connected to/coupled to the other element, or that a third element may be disposed therebetween.

Like reference numerals refer to like elements. Also, in the drawings, the thickness, the ratio, and the dimensions of elements are exaggerated for an effective description of technical contents. The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." The term "and/or," includes all combinations of one or more of which associated components may define.

It will be understood that, although the terms "first," "second," etc. may be used herein to describe various elements, these elements should not be limited by these terms. These terms are only used to distinguish one element from another. For example, a first element may be referred to as a second element, and a second element may also be referred to as a first element in a similar manner without departing the scope of rights of the present invention. The terms of a singular form may include the terms of a plural form unless the context clearly indicates otherwise.

In addition, terms such as "below," "lower," "above," "upper," and the like are used to describe the relationship of the components shown in the drawings. The terms are used as a relative concept and are described with reference to the direction indicated in the drawings.

It should be understood that the term "comprise," or "have" is intended to specify the presence of stated features, integers, steps, operations, elements, components, or combinations thereof in the disclosure, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which the invention pertains. It is also to be understood that terms such as terms defined in commonly used dictionaries should be interpreted as having meanings consistent with the meanings in the context of the related art, and should not be interpreted in too ideal a sense or an overly formal sense unless explicitly defined herein.

"About" "substantially the same" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value. Hereinafter, embodiments of the invention will be described with reference to the accompanying drawings.

FIG. 1 is a perspective view of an electronic device 1000 according to an embodiment of the invention.

Referring to FIG. 1, the electronic device 1000 may include a display device, and in the present embodiment, a mobile phone is exemplarily illustrated. However, the embodiment of the invention is not limited thereto, and the electronic device 1000 may be a tablet computer, a monitor, a television, a car navigation system, a game console, or a wearable device in another embodiment.

The electronic device 1000 may display an image through a display region 1000A. The display region 1000A may include a plane defined by a first direction DR1 and a second direction DR2. The display region 1000A may further include curved surfaces bent from at least two sides of the plane, respectively. However, the shape of the display region 1000A is not limited thereto. In another embodiment, for example, the display region 1000A may include only the plane, and the display region 1000A may further include four curved surfaces bent from at least two, for example, four sides of the plane, respectively.

A portion of the display region 1000A may be defined as a sensing region 1000SA. FIG. 1 exemplarily illustrates one sensing region 1000SA, but the number of the sensing region 1000SA is not limited thereto. The sensing region 1000SA may be a portion of the display region 1000A, but may have a higher transmittance of an optical signal than other regions of the display region 1000A. Therefore, an image may be displayed through the sensing region 1000SA, or an optical signal may be provided through the sensing region 1000SA.

The electronic device 1000 may include an electronic module disposed in a region overlapping the sensing region 1000SA in a plan view. The electronic module may receive an optical signal provided from the outside through the sensing region 1000SA, or may output an optical signal through the sensing region 1000SA. For example, the electronic module may be a camera module, a sensor, such as a proximity sensor, for measuring the distance between an object and a cellphone, a sensor for recognizing a part of a user's body (e.g., a fingerprint, iris, or face), or a small lamp for outputting light, but the embodiment of the invention is not particularly limited thereto.

The thickness direction of the electronic device 1000 may be a third direction DR3, which is the normal direction of the display region 1000A. The front surface (or the upper surface) and the rear surface (or the lower surface) of members constituting the electronic device 1000 may be defined on the basis of the third direction DR3.

Figures 2, 3:
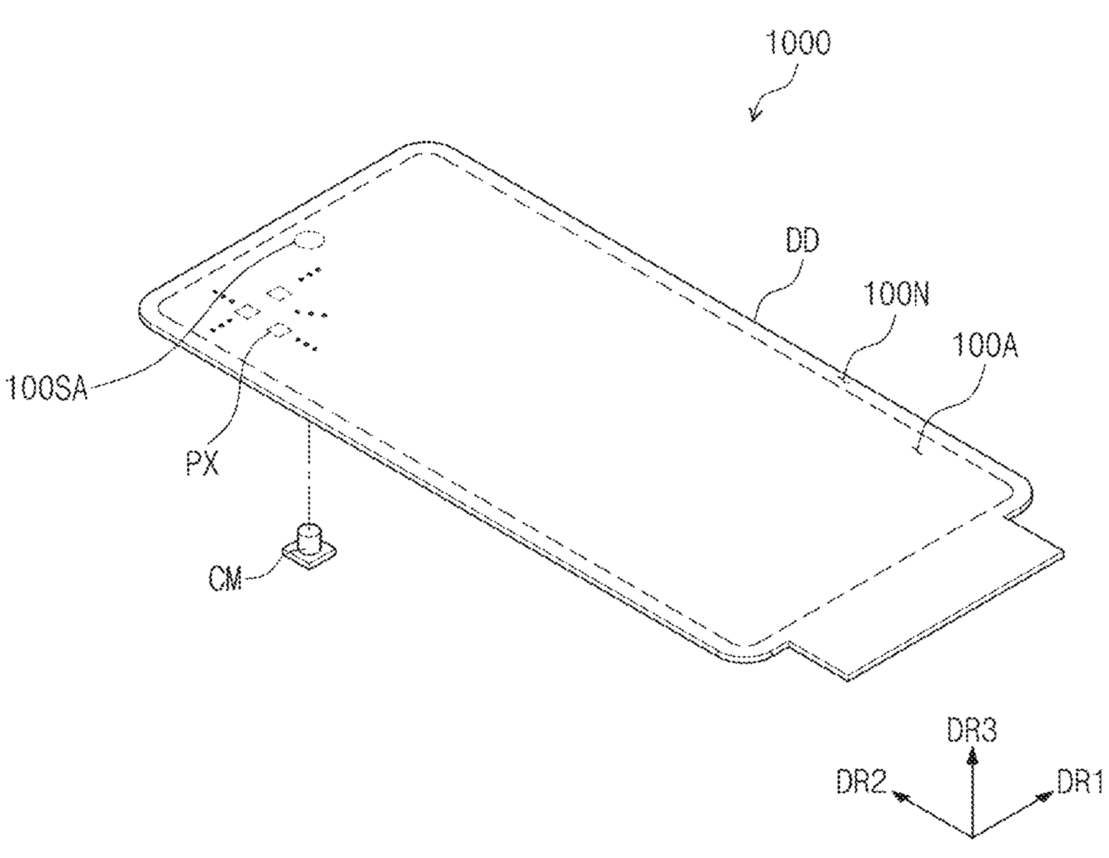
FIG. 2 is an exploded perspective view illustrating some components of an electronic device according to an embodiment of the invention.
FIG. 3 is a cross-sectional view of a display device according to an embodiment of the invention.

FIG. 2 is an exploded perspective view illustrating some components of the electronic device 1000 according to an embodiment of the invention.

Referring to FIG. 2, the electronic device 1000 may include a display device DD and an electronic module CM. The display device DD may generate an image, and sense an external input. The electronic module CM is disposed below the display device DD. When the display device DD is defined as a first electronic module constituting the electronic device 1000, the electronic module CM may be defined as a second electronic module. In an embodiment, the electronic module CM may be a camera module.

The display device DD may include a display region 100A and a peripheral region 100N. The display region 100A may correspond to the display region 1000A illustrated in FIG. 1. A portion of the display device DD may be defined as a sensing region 100SA, and the sensing region 100SA may have a higher light transmittance than other regions (hereinafter, main display regions) of the display region 100A. Therefore, the sensing region 100SA may provide external natural light to the electronic module CM. Being a part of the display region 100A, the sensing region 100SA may display an image.

In the display region 100A, a pixel PX is disposed. The pixel PX is each disposed in the sensing region 100SA and the main display regions. However, the configurations of the pixels PX disposed in the sensing region 100SA and in the main display regions may be different from each other. A detailed description thereof will be followed.

FIG. 3 is a cross-sectional view of the display device DD according to an embodiment of the invention.

Referring to FIG. 3, the display device DD may include a display panel 100, a sensor layer 200, and a reflection prevention layer 300.

The display panel 100 may be a component which substantially generates an image. The display panel 100 may be a light emission type display panel. For example, the display panel 100 may be an organic light emission display panel, an inorganic light emission display panel, a micro-LED display layer, or a nano-LED display layer. The display panel 100 may also be referred to as a display layer.

The display panel 100 may include a base layer 110, a circuit layer 120, a light emission element layer 130, and an encapsulation layer 140.

The base layer 110 may be a member which provides a base surface on which the circuit layer 120 is disposed. The base layer 110 may be a rigid substrate, or a flexible substrate capable of bending, folding, rolling, or the like. The base layer 110 may be a glass substrate, a metal substrate, a polymer substrate, or the like. However, the embodiment of the invention is not limited thereto, and the base layer 110 may be an inorganic layer, an organic layer, or a composite material layer in another embodiment.

The base layer 110 may have a multi-layered structure. For example, the base layer 110 may include a first synthetic resin layer, a multi-layered or single-layered inorganic layer, and a second synthetic resin layer disposed above the multi-layered or single-layered inorganic layer. Each of the first and second synthetic resin layers may include a polyimide-based resin, but the embodiment of the invention is not particularly limited thereto.

The circuit layer 120 may be disposed above the base layer 110. The circuit layer 120 may include an insulation layer, a semiconductor pattern, a conductive pattern, a signal line, or the like. Above the base layer 110, an insulation layer, a semiconductor layer, and a conductive layer are formed by coating, deposition, or the like, and thereafter, the insulation layer, the semiconductor layer, and the conductive layer may be selectively patterned through performing a photolithography process and an etching process a plurality of times.

The light emission element layer 130 may be disposed above the circuit layer 120. The light emission element layer 130 may include a light emission element. For example, the light emission element may include an organic light emission material, an inorganic light emission material, an organic-inorganic light emission material, a quantum dot, a quantum rod, a micro-LED, or a nano-LED.

The encapsulation layer 140 may be disposed above the light emission element layer 130. The encapsulation layer 140 may protect the light emission element layer 130 from foreign materials such as moisture, oxygen, and dust particles. The encapsulation layer 140 may include at least one inorganic layer. The encapsulation layer 140 may include a stacked structure of an inorganic layer/an organic layer/an inorganic layer.

The sensor layer 200 may be disposed above the display panel 100. The sensor layer 200 may sense an external input applied from the outside. The external input may be a user input. The user input includes various forms of external inputs such as a part of a user's body, light, heat, a pen, and pressure.

The sensor layer 200 may be formed above the display panel 100 through a series of processes. In this case, the sensor layer 200 may be directly disposed above the display panel 100. Here, "being directly disposed" may mean that a third component is not disposed between the sensor layer 200 and the display panel 100. That is, a separate adhesive member may not be disposed between the sensor layer 200 and the display panel 100.

The reflection prevention layer 300 may be directly disposed above the sensor layer 200. The reflection prevention layer 300 may reduce the reflectance of external light incident from the outside of the display device DD. The reflection prevention layer 300 may be formed above the sensor layer 200 through a series of processes. The reflection prevention layer 300 may include color filters. The color filters may have a predetermined arrangement. For example, the color filters may be arranged in consideration of light emission colors of pixels included in the display panel 100. In addition, the reflection prevention layer 300 may further include a black matrix adjacent to the color filters. The reflection prevention layer 300 will be described in detail later.

In an embodiment of the invention, the sensor layer 200 may be omitted. In this case, the reflection prevention layer 300 may be directly disposed above the display panel 100. In an embodiment of the invention, the positions of the sensor layer 200 and the reflection prevention layer 300 may be changed.

Although not illustrated, in an embodiment of the invention, the display device DD may further include an optical layer disposed above the reflection prevention layer 300. For example, the optical layer may be formed above the reflection prevention layer 300 through a series of processes. The optical layer may improve front-surface luminance of display device DD by controlling the direction of light incident from the display panel 100. For example, the optical layer may include an organic insulation layer in which openings are defined corresponding to light emission regions of the pixels included in the display panel 100, respectively, and a high refraction layer covering the organic insulation layer and filled in the openings. The high refraction layer may have a higher refractive index than the organic insulation layer.

Figure 4:
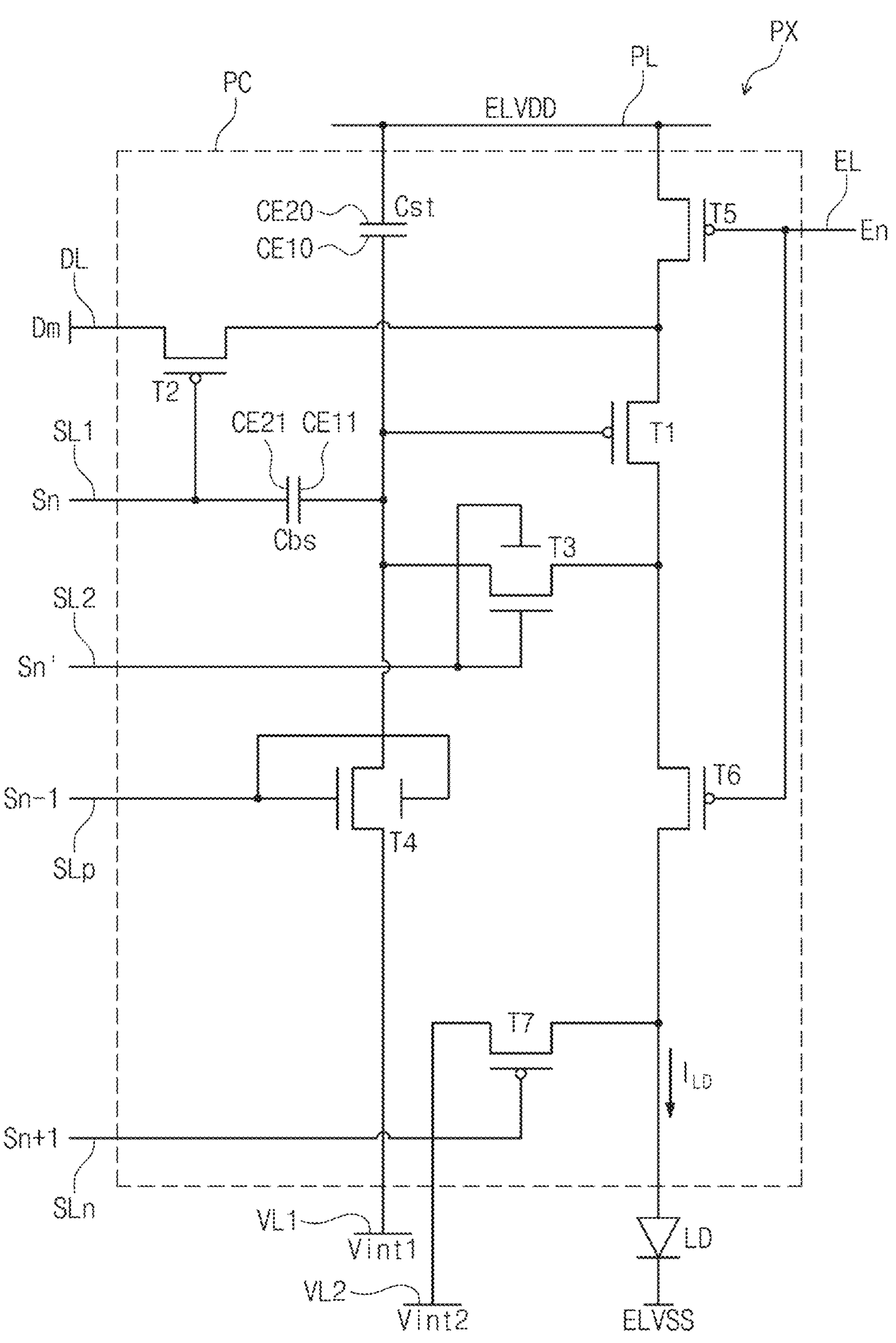
FIG. 4 is an equivalent circuit diagram of a pixel according to an embodiment of the invention.

FIG. 4 is an equivalent circuit diagram of the pixel PX according to an embodiment of the present invention.

Referring to FIG. 4, the equivalent circuit diagram of one of a plurality of pixels PX illustrated in FIG. 2 is illustrated. The pixel PX may include a light emission element LD and a pixel circuit PC. The light emission element LD may be a component included in the light emission element layer 130 of FIG. 3, and the pixel circuit PC may be a component included in the circuit layer 120 of FIG. 3.

The pixel circuit PC may include a plurality of thin film transistors T1 to T7 and a storage capacitor Cst. The plurality of thin film transistors T1 to T7 and the storage capacitor Cst may be electrically connected to signal lines SL1, SL2, SLp, SLn, EL, and DL, a first initialization voltage line VL1, a second initialization voltage line VL2 (or an anode initialization voltage line), and a driving voltage line PL.

The plurality of thin film transistors T1 to T7 may include a driving thin film transistor T1 (or a first thin film transistor), a switching thin film transistor T2 (or a second thin film transistor), a compensation thin film transistor T3 (or a third thin film transistor), a first initialization thin film transistor T4 (or a fourth thin film transistor), an operation control thin film transistor T5 (or a fifth thin film transistor), a light emission control thin film transistor T6 (or a sixth thin-film transistor) and a second initialization thin film transistor T7 (or a seventh thin film transistor).

The light emission element LD may include a first electrode (e.g., an anode or a pixel electrode) and a second electrode (e.g., a cathode or a common electrode), and the first electrode of the light emission element LD may be connected to the driving thin film transistor T1 by means of the light emission control thin film transistor T6 and provided with a driving current ILD, and the second electrode may be provided with a low power voltage ELVSS. The light emission element LD may generate light of luminance corresponding to the driving current ILD.

Some of the plurality of thin film transistors T1 to T7 may be re-channel MOSFETs ("NMOS"), and the others thereof may be p-channel MOSFETs ("PMOS"). For example, among the plurality of thin film transistors T1 to T7, the compensation thin film transistor T3 and the first initialization thin film transistor T4 may be n-channel MOSFETs (NMOS), and the others thereof may be p-channel MOSFETs (PMOS).

According to an embodiment of the invention, among the plurality of thin film transistors T1 to T7, the compensation thin film transistor T3, the first initialization thin film transistor T4, and the second initialization thin film transistor T7 may be NMOSs, and the others thereof may be PMOSs. According to an embodiment of the invention, only one among the plurality of thin film transistors T1 to T7 may be an NMOS, and the others thereof may be PMOSs. According to an embodiment of the invention, the plurality of thin film transistors T1 to T7 may all be NMOSs, or may all be PMOSs The signal lines may include a first current scan line SL1 which transmits a first scan signal Sn, a second current scan line SL2 which transmits a second scan signal Sn', a prior scan line SLp which transmits a prior scan signal Sn−1 to the first initialization thin film transistor T4, a light emission control line EL which transmits a light emission control signal En to the operation control thin film transistor T5 and the light emission control thin film transistor T6, a next scan line SLn which transmits a next scan signal Sn+1 to the second initialization thin film transistor T7, and a data line DL which crosses the first scan line SL1 and transmits a data signal Dm.

The driving voltage line PL may transmit a driving voltage ELVDD to the driving thin film transistor T1, and the first initialization voltage line VL1 may transmit an initialization voltage Vint1 which initializes the driving thin film transistor T1 and the first electrode of the light emission element LD.

A gate of the driving thin film transistor T1 may be connected to the storage capacitor Cst, a source of the driving thin film transistor T1 may be connected to the driving voltage line PL via the operation control thin film transistor T5, a drain of the driving thin film transistor T1 may be electrically connected to the first electrode of the light emission element LD via the light emission control thin film transistor T6. The driving thin film transistor T1 may receive the data signal Dm in accordance with a switching operation of the switching thin film transistor T2 and supply the driving current ILD to the light emission element ED.

A gate of the switching thin film transistor T2 may be connected to the first current scan line SL1 which transmits the first scan signal Sn, a source of the switching thin film transistor T2 may be connected to the data line DL, and a drain of the switching thin film transistor T2 may be connected to the source of the driving thin film transistor T1 and connected to the driving voltage line PL via the operation control thin film transistor T5. The switching thin film transistor T2 may be turned on in accordance with the first scan signal Sn received through the current first scan line SL1 and perform a switching operation of transmitting the data signal Dm transmitted through the data line DL to the source of the driving thin film transistor T1.

A gate of the compensation thin film transistor T3 is connected to the second current scan line SL2. A drain of the compensation thin film transistor T3 may be connected to the drain of the driving thin film transistor T1 and connected to the first electrode of the light emission element LD via the light emission control thin film transistor T6. A source of the compensation thin film transistor T3 may be connected to a first capacitor electrode CE10 of the storage capacitor Cst and to the gate of the driving thin film transistor T1. In addition, the source of the compensation thin film transistor may be connected to the drain of the first initialization thin film transistor T4.

The compensation thin film transistor T3 may be turned on in accordance with the second scan signal Sn' received through the second current scan line SL2 and electrically connect the gate of the driving thin film transistor T1 and the drain thereof to diode connect the driving thin film transistor T1.

A gate of the first initialization thin film transistor T4 may be connected to the prior scan line SLp. A source of the first initialization thin film transistor T4 may be connected to a source of the second initialization thin film transistor T7 and to the first initialization voltage line VL1. The drain of the first initialization thin film transistor T4 may be connected to the first capacitor electrode CE10 of the storage capacitor Cst, the source of the compensation thin film transistor T3, and the gate of the driving thin film transistor T1. The first initialization thin film transistor T4 may be turned on in accordance with the prior scan signal Sn−1 received through the prior scan line SLp and perform an initialization operation of initializing a voltage of the gate of the driving thin film transistor T1 by transmitting the initialization voltage Vint1 to the gate of the driving thin film transistor T1.

A gate of the operation control thin film transistor T5 may be connected to the light emission control line EL, an operation control source of the operation control thin film transistor T5 may be connected to the driving voltage line PL, and a drain of the operation control thin film transistor T5 may be connected to the source of the driving thin film transistor T1 and to the drain of the switching thin film transistor T2.

A gate of the light emission control thin film transistor T6 may be connected to the light emission control line EL, a light emission control source of the light emission control thin film transistor T6 may be connected to the drain of the driving thin film transistor T1 and to the drain of the compensation thin film transistor T3, and a drain of the light emission control thin film transistor T6 may be electrically connected to a drain of the second initialization thin film transistor T7 and to the first electrode of the light emission element LD.

The operation control thin film transistor T5 and the light emission control thin film transistor T6 are simultaneously turned on in accordance with the light emission control signal En received through the light emission control line EL, so that the driving voltage ELVDD is transmitted to the light emission element LD to allow the driving current ILD to flow in the light emission element LD.

A gate of the second initialization thin film transistor T7 may be connected to the next scan line SLn, the drain of the second initialization thin film transistor T7 may be connected to the drain of the light emission control thin film transistor T6 and to the first electrode of the light emission element LD, and the source of the second initialization thin film transistor T7 may be connected to the second initialization voltage line VL2 to be provided with an anode initialization voltage Vint2. The second initialization thin film transistor T7 is turned on in accordance with the next scan signal Sn+1 received through the next scan line SLn and initializes the first electrode of the light emission element LD.

In another embodiment, the second initialization thin film transistor T7 may be connected to the light emission control line EL and driven in accordance with the light emission control signal En. Meanwhile, positions of a source and a drain may be changed depending on the type (p-type or n-type) of a transistor.

The storage capacitor Cst may include the first capacitor electrode CE10 and a second capacitor electrode CE20. The first capacitor electrode CE10 of the storage capacitor Cst is connected to the gate of the of the driving thin film transistor T1, and the second capacitor electrode CE20 of the storage capacitor Cst is connected to the driving voltage line PL. In the storage capacitor Cst, electric charges corresponding to the difference between the voltage of the gate of the driving thin film transistor T1 and the driving voltage ELVDD may be stored.

A boosting capacitor Cbs may include a first capacitor electrode CE11' and a second capacitor electrode CE21'. The first capacitor electrode CE11' of the boosting capacitor Cbs may be connected to the first capacitor electrode CE11 of the storage capacitor Cst, and the second capacitor electrode CE21' of the boosting capacitor Cbs may be provided with the first scan signal Sn. The boosting capacitor Cbs may increase the voltage of a gate of the driving thin film transistor T1 at the time when the supply of the first scan signal Sn is stopped, thereby compensating for a voltage drop of the gate.

The specific operation of each pixel PX according to an embodiment is as follows.

During an initialization period, when the previous scan signal Sn−1 is supplied through the previous scan line SLp, the first initialization thin film transistor T4 is turned on in correspondence to the previous scan signal Sn−1, and the driving thin film transistor T1 is initialized by the initialization voltage Vint1 supplied from the first initialization voltage line VL1.

During a data programming period, when the first scan signal Sn and the second scan signal Sn' are supplied through the first current scan line SL1 and the second current scan line SL2, the switching thin film transistor T2 and the compensation thin film transistor T3 are turned on in correspondence to the first scan signal Sn and the second significantly scan signal Sn'. At this time, the driving thin film transistor T1 is diode connected by the turned-on compensation thin film transistor T3, and is biased in a forward direction.

Then, a compensation voltage Dm+Vth (where Vth is the value of (−)) reduced by a threshold voltage Vth of the driving thin film transistor T1 from the data signal Dm supplied from the data line DL is applied to the gate of the of the driving thin film transistor T1.

To opposite ends of the storage capacitor Cst, the driving voltage ELVDD and the compensation voltage Dm+Vth are applied, and in the storage capacitor Cst, electric charges corresponding to the voltage difference between the opposite ends are stored.

During a light emission period, the operation control thin film transistor T5 and the light emission control thin film transistor T6 are turned on by the light emission control signal En supplied from the light emission control line EL. The driving current $I_{LD}$ corresponding to the voltage difference between the voltage of the gate of the driving thin film transistor T1 and the driving voltage ELVDD is generated, and through the light emission control thin film transistor T6, the driving current ILD is supplied to the light emission element LD.

In the present embodiment, at least one of the plurality of thin film transistors T1 to T7 includes a semiconductor layer including an oxide, and the others thereof include a semiconductor layer including silicon.

Specifically, the driving thin film transistor T1 which directly affects the brightness of a display device is configured to include a semiconductor layer made of polycrystalline silicon having high reliability, through which a high-resolution display device may be implemented.

Meanwhile, since an oxide semiconductor has high carrier mobility and low leakage current, a voltage drop is not large even when driving time is long. That is, since there is no significant change in the color of an image due to a voltage drop even during low-frequency driving, low-frequency driving is possible.

Since the oxide semiconductor has the advantage of low leakage current as described above, at least one of the compensation thin film transistor T3, the first initialization thin film transistor T4, or the second initialization thin film transistor T7 connected to the gate of the driving thin film transistor T1 may be employed as an oxide semiconductor to prevent leakage current which may flow to the gate and also to reduce power consumption.

Figure 5:
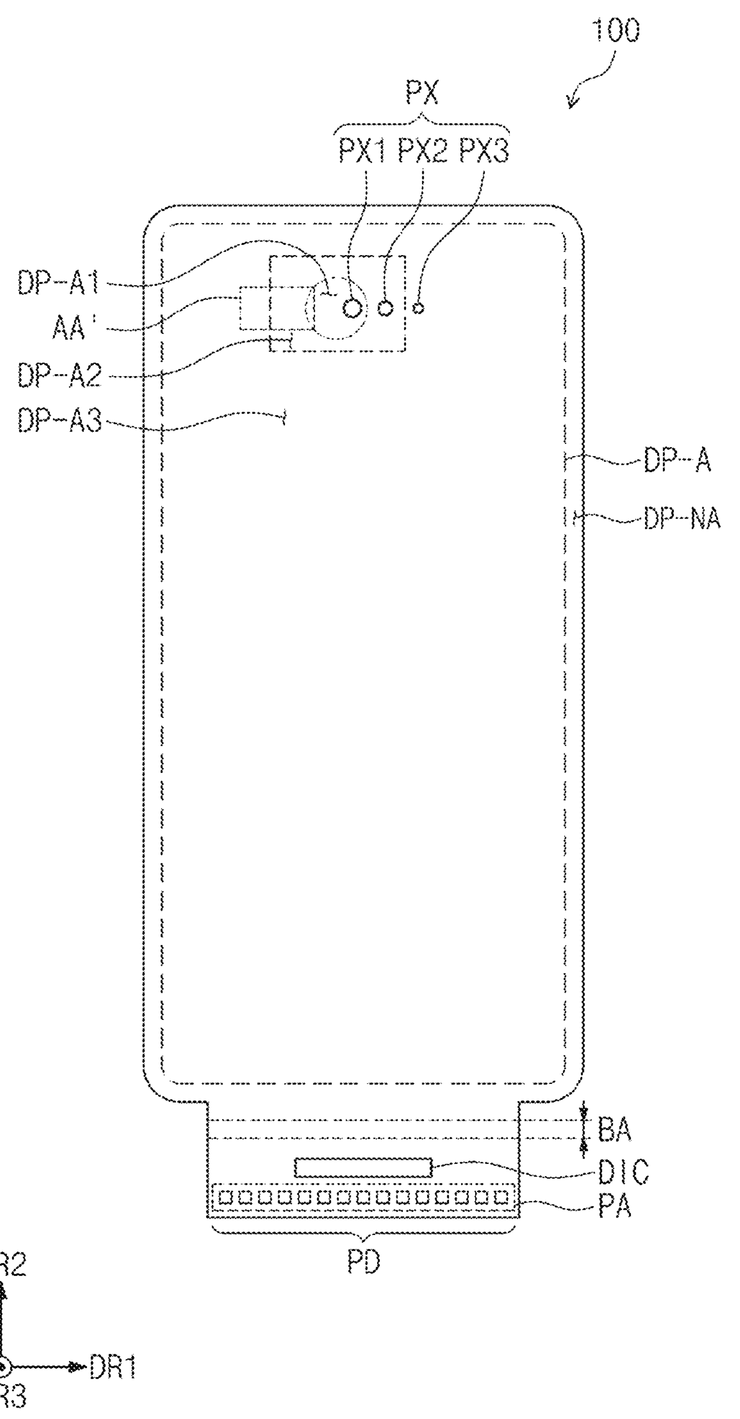
FIG. 5 is a plan view of a display panel according to an embodiment of the invention.
Figure 6:
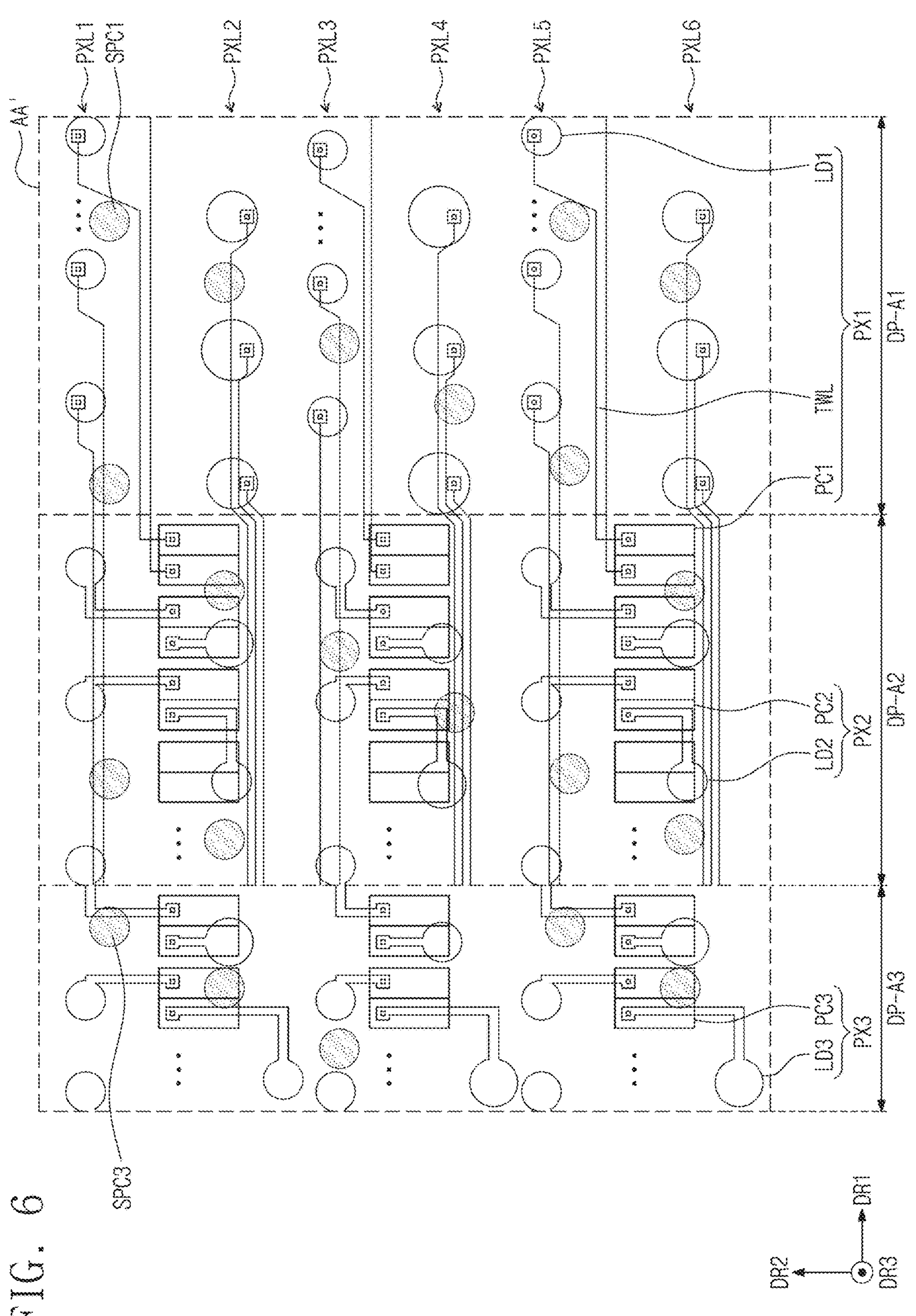
FIG. 6 is a plan view of enlarged region AA' of FIG. 5.

FIG. 5 is a plan view of the display panel 100 according to an embodiment of the invention. FIG. 6 is a plan view of enlarged region AA' of FIG. 5. As used herein, the "plan view" is a view in a thickness direction (i.e., third direction DR3) of the electronic device 1000.

Referring FIG. 5 and FIG. 6, the display panel 100 may include and a display region DP-A and a peripheral region DP-NA. The peripheral region DP-NA may be adjacent to the display region DP-A and may surround at least a portion of the display region DP-A.

A driving unit DIC may be disposed in the peripheral region DP-NA. The driving unit DIC may be mounted in the form of a chip in the peripheral region DP-NA. The driving unit DIC may provide data signals to pixels PX disposed in the display region DP-A.

A pad region PA may be defined in the peripheral region DP-NA. A plurality of pads PD may be disposed in the pad region PA, and the plurality of pads PD may transmit an electrical signal to the pixel PX through the driving unit DIC.

A bending region BA may be defined in the peripheral region DP-NA. As the bending region BA is bent, the plurality of pads PD and the driving unit DIC may face the display region DP-A in the third direction DR3. The bending region BA will be described in detail later with reference to FIG. 13A to FIG. 13C.

The display region DP-A may include a first region DP-A1, a second region DP-A2, and a third region DP-A3. The first region DP-A1 may be referred to as a component region, the second region DP-A2 may be referred to as an intermediate region or a transition region, and the third region DP-A3 may be referred to as a general display region or a main display region. The first display area DP-A1 and the second display area DP-A2 may be referred to as an auxiliary display region. The first region DP-A1 may overlap (or correspond to) the sensing region 1000SA illustrated in FIG. 1 or the sensing region 100SA illustrated in FIG. 2 in a plan view. In the present embodiment, the first region DP-A1 is illustrated in a circular shape, but may have various shapes such as a polygon, an ellipse, a figure with at least one curved side, or an irregular shape, and is not limited to any one embodiment.

The first region DP-A1, the second region DP-A2, and the third region DP-A3 may be distinguished by light transmittance or resolution. The light transmittance and the resolution are measured in a reference area.

The first region DP-A1 has a higher light transmittance than each of the second region DP-A2 and the third region DP-A3. This is because the first region has a lower ratio of the area occupied by a light blocking structure to be described later than each of the second region DP-A2 and the third region DP-A3 have. The light blocking structure may include a conductive pattern of a circuit layer, a pixel definition film, a pixel definition pattern, or the like.

The third region DP-A3 has a higher resolution than each of the first region DP-A1 and the second region DP-A2. The third region DP-A3 has a larger number of light emission elements disposed in the reference area (or the same area) than the first region DP-A1 or the second region DP-A2 does.

When distinguishing based on light transmittance, the first region DP-A1 may be a first transmittance region, and the second region DP-A2 and the third region DP-A3 may be different portions of a second transmittance region distinguished from the first transmittance region. The second region DP-A2 and the third region DP-A3 may have substantially the same light transmittance. Even when the second region DP-A2 and the third region DP-A3 do not have the same transmittance, the light transmittance of the first region DP-A1 is significantly high compared to the light transmittance of each of the second region DP-A2 and the third region DP-A3, so that when the first region DP-A1 is defined as the first transmittance region, the second region DP-A2 and the third region DP-A3 may be defined as the second transmittance region.

When distinguishing based on resolution, the first region DP-A1 or the second region DP-A2 may be a first resolution region, and the third region DP-A3 may be a second resolution region distinguished from the first resolution region.

The display panel 100 may be include the plurality of pixels PX. The pixel PX may include a first pixel PX1 including a light emission element disposed in the first region DP-A1, a second pixel PX2 including a light emission element disposed in the second region DP-A2, and a third pixel PX3 including a light emission element disposed in the third region DP-A3. The first pixel PX1, the second pixel PX2, and the third pixel PX3 may each include the pixel circuit PC illustrated in FIG. 4.

The first pixel PX1, the second pixel PX2, and the third pixel PX3 may each be provided in plurality. In this case, each of the first pixel PX1, the second pixel PX2, and the third pixel PX3 may include a red pixel, a green pixel, and a blue pixel, and depending on an embodiment, may further include a white pixel.

Referring to FIG. 6, the first pixel PX1 may include a first light emission element LD1 and a first pixel circuit PC1 which drives the first light emission element LD1, the second pixel PX2 may include a second light emission element LD2 and a second pixel circuit PC2 which drives the second light emission element LD2, and the third pixel PX3 may include a third light emission element LD3 and a third pixel circuit PC3 which drives the third light emission element LD3.

The positions of the first pixel PX1, the second pixel PX2, and the third pixel PX3 illustrated in FIG. 5 are illustrated on the basis of the positions of the first, second, and third light emission elements LD1, LD2, and LD3.

In FIG. 6, a first electrode of a light emission element is illustrated representative of the first light emission element LD1, the second light emission element LD2, and the third light emission element LD3.

The first region DP-A1 may be provided in a region overlapping the electronic module CM (see FIG. 2) in a plan view. For example, an external input (e.g., light) may be provided to the electronic module CM through the first region DP-A1, and an output from the electronic module CM may be emitted to the outside through the first region DP-A1.

In order to improve the light transmittance of the first region DP-A1 by increasing a transmission area, the number of the first light emission element LD1 disposed in the reference area may be smaller than the number of the third light emission element LD3.

For example, the resolution of the first region DP-A1 may be about 1/2, 3/8, 1/3, 1/4, 2/9, 1/8, 1/9, 1/16 or the like of the resolution of the third region DP-A3. For example, the resolution of the third region DP-A3 may be about 400 pixels per inch (ppi) or higher, and the resolution of the first region DP-A1 may be about 200 ppi or 100 ppi. However, this is only an example, and the embodiment of the invention is not particularly limited thereto. However, the area of a first electrode of the first light emission element LD1 corresponding to some colors may be greater than the area of a first electrode of the third light emission element LD3.

In addition, in order to improve the light transmittance of the first region DP-A1 by removing a light blocking structure such as a transistor, the first pixel circuit PC1 may be disposed in the second region DP-A2 or the peripheral region DP-NA instead of the first region DP-A1. In the first region DP-A1, a region in which the first light emission element LD1 is not disposed may be defined as a transmission region. Specifically, in the first region DP-A1, a region in which the first electrode of the first light emission element LD1 is not disposed may be defined as a transmission region.

In the second region DP-A2, the first pixel circuit PC1 is disposed in a region in which the second pixel circuit PC2 is not disposed.

The first light emission element LD1 may be electrically connected to the first pixel circuit PC1 through a connection line TWL. A detailed description thereof will be followed.

The connection line TWL may include a transparent conductive material. For example, the connection line TWL may include a transparent conductive oxide ("TCO") such as indium tin oxide ("ITO"), indium zinc oxide ("IZO"), indium gallium zinc oxide ("IGZO"), zinc oxide (ZnO), or indium oxide ($In_2O_3$). The connection line TWL including a transparent conductive material does not correspond to a light blocking structure.

The second region DP-A2 is adjacent to the first region DP-A1. The second region DP-A2 may surround at least a portion of the first region DP-A1. The second region DP-A2 may be a region having a lower light transmittance than the first region DP-A1. This is because the second region DP-A2 has a higher ratio of the area occupied by a light blocking structure to be described later than the first region DP-A1 has.

As illustrated in FIG. 5, the second region DP-A2 may be spaced apart from the peripheral region DP-NA. However, the embodiment of the invention is not limited thereto, and the second region DP-A2 may be in contact with the peripheral region DP-NA in another embodiment.

In FIG. 6, a pixel circuit not connected to the connection line TWL or the second light emission element LD2 substantially corresponds to the first pixel circuit PC1. However, since only a portion of the first light emission element LD1 is illustrated in FIG. 6, the connection line TWL to be connected to the first pixel circuit PC1 is not illustrated.

The third region DP-A3 is adjacent to the second region DP-A2. The third region DP-A3 may have a lower light transmittance than the first region DP-A1. In the third region DP-A3, the third light emission element LD3 and the third pixel circuit PC3 may be disposed.

Referring to FIG. 6, it can be seen that in the first region DP-A1 and in the second region DP-A2, first to sixth light emission element rows PXL1 to PXL6 are disposed. In each of the first, third, and fifth light emission element rows PXL1, PXL3, and PXL5, green light emission elements which generate green light are arranged along the first direction DR1.

In each of the second, fourth, and sixth light emission element rows PXL2, PXL4, and PXL6, blue light emission elements which generate blue light and red light emission elements which generate red light are alternately disposed along the first direction DR1. In the second direction DR2, the red light emission element of the second light emission element row PXL2 is aligned with the blue light emission element of the fourth light emission element row PXL4. First electrodes of the blue light emission elements may have greater areas than first electrodes of the red light emission elements do.

In the third region DP-A3, first electrodes having less areas than those of the first region DP-A1 or the second region DP-A2 are illustrated. Also in the third region DP-A3, first to fourth light emission element rows corresponding to the first to fourth light emission element rows PXL1 to PXL4 may form one group, and repeatedly disposed along the second direction DR2.

The first, second, and third light emission elements LD1, LD2, and LD3 illustrated in FIG. 6 may correspond to the shape on a plane (e.g., in a plan view) of a first electrode AE1 (see FIG. 8) of the first light emission element LD1, a second electrode AE2 (see FIG. 8) of the second light emission element LD2, and a third electrode AE3 (see FIG. 7) of the third light emission element LD3, respectively.

In FIG. 6, a first spacer SPC1 disposed in the first region DP-A1, and a third spacer SPC3 disposed in the second and third regions DP-A2 and DP-A3 are illustrated together.

The first spacer SPC1 is provided in plurality, and may be disposed in the first region DP-A1 at predetermined intervals. The third spacer SPC3 may be disposed in plurality in the second and third regions DP-A2 and DP-A3 at predetermined intervals.

The first spacer SPC1 may be disposed spaced apart from the first electrode AE1 (see FIG. 8) of the first light emission element LD1. The third spacer SPC3 may be disposed spaced apart from the second electrode AE2 (see FIG. 8) of the second light emission element LD2 and the third electrode AE3 (see FIG. 7) of the third light emission element LD3.

The first spacer SPC1 may include a transparent insulation material. For example, the first spacer SPC1 may include a general-purpose polymer such as benzocyclobutene ("BCB"), polyimide, hexamethyldisiloxane ("HMDSO"), polymethylmethacrylate ("PMMA"), or polystyrene ("PS"), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof. However, the embodiment of the invention is not limited thereto.

The third spacer SPC3 may include the same material as a material of the first spacer SPC1, or may include an opaque insulation material unlike the first spacer SPC1. For example, the third spacer SPC3 may include the same material as a material of a pixel definition film PDL (see FIG. 7). However, the embodiment of the invention is not limited thereto.

The first spacer SPC1 and the third spacer SPC3 may increase the scratch strength of the display panel 100 to lower a defect rate due to pressing pressure. In addition, the first spacer SPC1 and the third spacer SPC3 have high adhesion with light emission layers EL1, EL2, and EL3 (see FIG. 7 and FIGS. 8) and the like positioned thereabove, and thus, may prevent moisture and air from entering between layers of the display panel 100 from the outside. When the display panel 100 has flexible properties, the high adhesion may prevent the problem in which adhesion decreases between the layers during folding and unfolding operations of the display panel 100.

Additional descriptions of the first spacer SPC1 and the third spacer SPC3 will be given later.

Figure 7:
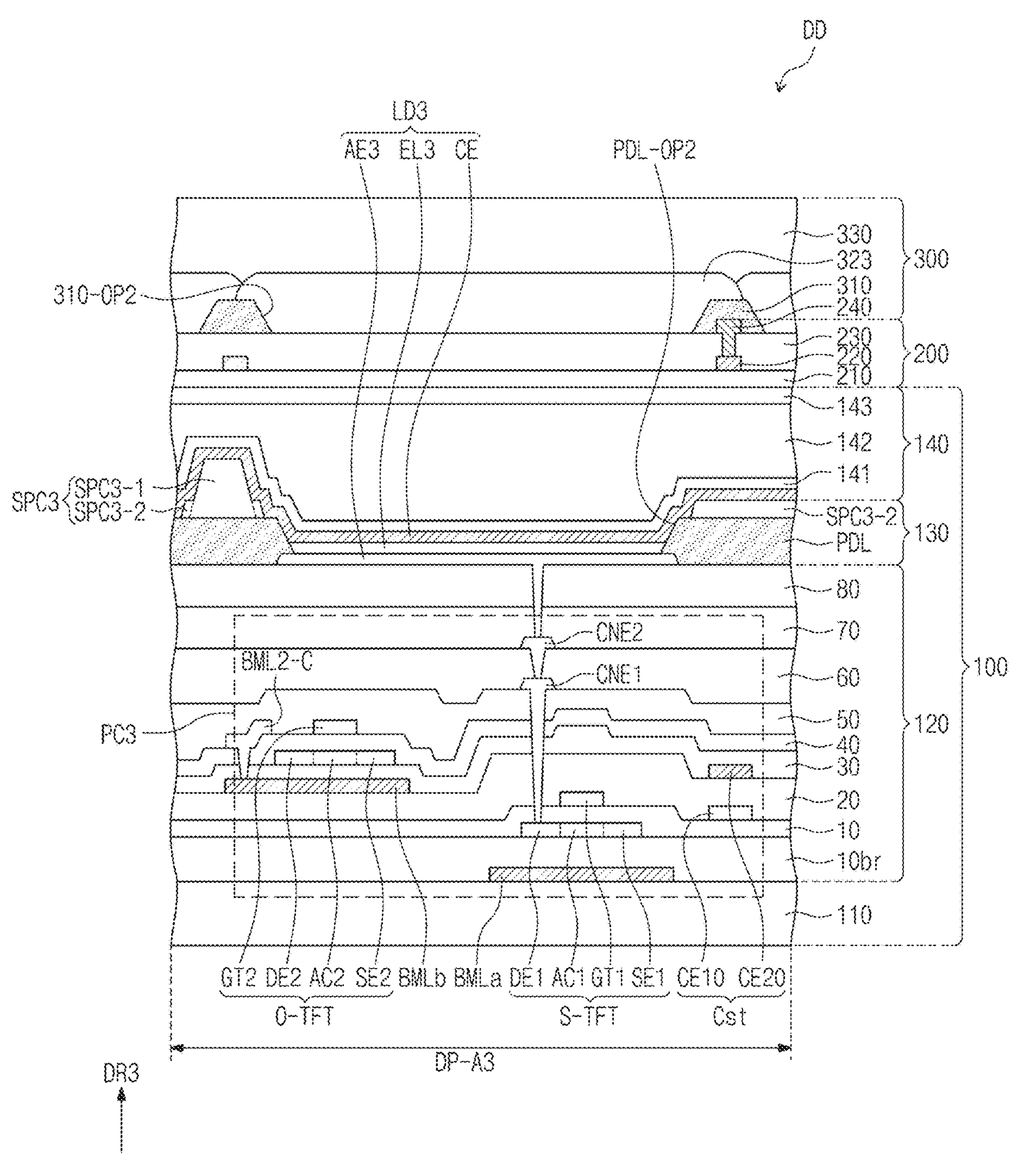
FIG. 7 is a cross-sectional view of a display device according to an embodiment of the invention.
Figure 8:
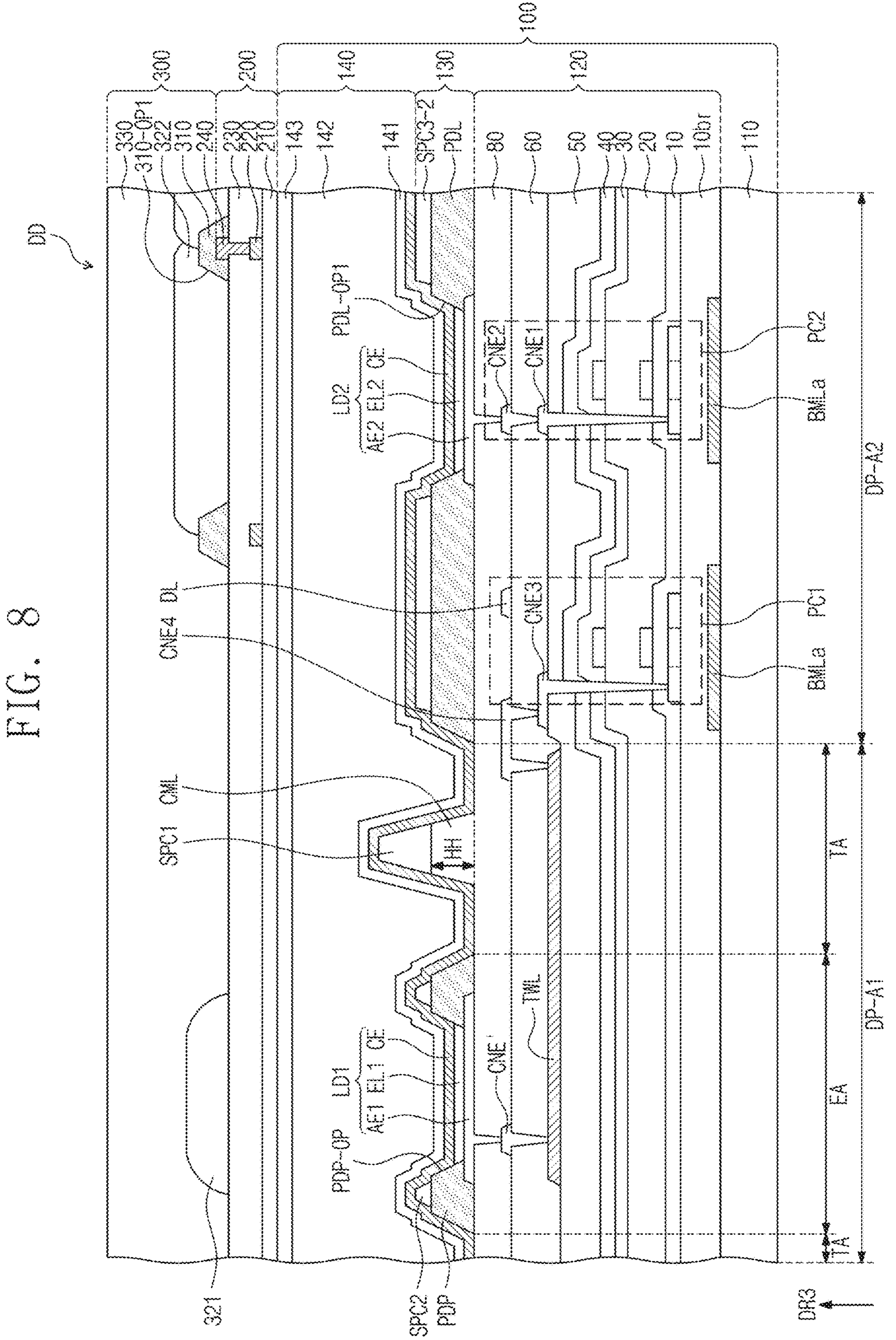
FIG. 8 is a cross-sectional view of a display device according to an embodiment of the invention.

FIG. 7 is a cross-sectional view of the display device DD according to an embodiment of the invention. FIG. 8 is a cross-sectional view of the display device DD according to an embodiment of the invention.

FIG. 7 is a cross-sectional view of the third region DP-A3, and FIG. 8 is a cross-sectional view of the first region DP-A1 and the second region DP-A2.

In FIG. 7, a silicon thin film transistor S-TFT and an oxide thin film transistor O-TFT of the third light emission element LD3 and the third pixel circuit PC3 are illustrated. In the equivalent circuit illustrated in FIG. 4, the third and fourth transistors T3 and T4 may be oxide thin film transistors O-TFT, and the other transistors may be silicon thin film transistors S-TFT. In FIG. 8, portions of the first light emission element LD1 and the first pixel circuit PC1 are illustrated, and portions of the second light emission element LD2 and the second pixel circuit PC2 are illustrated. A thin film transistor illustrated in FIG. 8 may be the sixth transistor T6 illustrated in FIG. 4.

Hereinafter, a description will be given with reference to FIG. 7 and FIG. 8 together.

A buffer layer **10*br* may be disposed above the base layer 110. The buffer layer 10*br* may prevent metal atoms or impurities from diffusing into a first semiconductor pattern from the base layer 110. In addition, the buffer layer 10*br*** may control the rate of providing heat during a crystallization process for forming the first semiconductor pattern, thereby allowing the first semiconductor pattern to be uniformly formed.

A first rear metal layer BMLa may be disposed below the silicon thin film transistor S-TFT, and a second rear metal layer BMLb may be disposed below the oxide thin film transistor O-TFT. The first and second rear metal layers BMLa and BMLb may be disposed overlapping the first to third pixel circuits PC1, PC2, and PC3 in a plan view. The first and second rear metal layers BMLa and BMLb may block an electric potential due to polarization from affecting the first to third pixel circuits PC1, PC2, and PC3.

The first rear metal layer BMLa may be disposed corresponding to at least a portion of each of the first to third pixel circuit PC1, PC2, and PC3 (see FIG. 6). The first rear metal layer BMLa may be disposed to overlap the driving thin film transistor T1 (see FIG. 4) implemented as the silicon thin film transistor S-TFT in a plan view.

The first rear metal layer BMLa may be disposed between the base layer 110 and the buffer layer **10*br*. In an embodiment of the invention, an inorganic barrier layer may be further disposed between the first rear metal layer BMLa and the buffer layer 10*br***. The first rear metal layer BMLa may be connected to an electrode or a line, and may receive a constant voltage or a signal therefrom. According to an embodiment of the invention, the first rear metal layer BMLa may be a floating electrode in a form isolated from another electrode or line.

The second rear metal layer BMLb may be disposed corresponding to a lower portion of the oxide thin film transistor O-TFT. The second rear metal layer BMLb may be disposed between a second insulation layer 20 and a third insulation layer 30. The second rear metal layer BMLb may be disposed in the same layer as the second capacitor electrode CE20 of the storage capacitor Cst. The second rear metal layer BMLb may be connected to a contact electrode BML2-C to receive a constant voltage or a signal therefrom. The contact electrode BML2-C may be disposed in the same layer as a gate GT2 of the oxide thin film transistor O-TFT.

The first rear metal layer BMLa and the second rear metal layer BMLb may each include a reflective metal. For example, the first rear metal layer BMLa and the second rear metal layer BMLb may include silver (Ag), an alloy containing silver (Ag), molybdenum (Mo), an alloy containing molybdenum, aluminum (Al), an alloy containing aluminum, aluminum nitride (AlN), tungsten (W), tungsten nitride (WN), copper (Cu), titanium (Ti) p+ doped amorphous silicon, or the like. The first rear metal layer BMLa and the second rear metal layer BMLb may include the same material, or may include different metals.

Although not separately illustrated, according to an embodiment of the invention, the second rear metal layer BMLb may be omitted. The rear metal layer BMLa may be extended to the lower portion of the oxide thin film transistor O-TFT to block an electric potential due to polarization from affecting the oxide thin film transistor O-TFT.

The first semiconductor pattern may be disposed above the buffer layer **10*br***. The first semiconductor pattern may include a silicon semiconductor.

For example, the silicon semiconductor may include amorphous silicon, polycrystalline silicon, or the like. For example, the first semiconductor pattern may include low temperature polysilicon.

FIG. 7 and FIG. 8 only illustrate a portion of the first semiconductor pattern disposed above the buffer layer **10*br***, and the first semiconductor pattern may further be disposed in another region. The first semiconductor pattern may be arranged according to a specific rule across pixels. The first semiconductor pattern may have different electrical properties depending on whether or not the first semiconductor pattern is doped. The first semiconductor pattern may include a first region having a high conductivity rate and a second region having a low conductivity rate. The first region may be doped with an N-type dopant or a P-type dopant. A P-type transistor may include a doped region which has been doped with the P-type dopant, and an N-type transistor may include a doped region which has been doped with the N-type dopant. The second region may be a non-doped region or a region doped to lower concentration than the first region.

The conductivity of the first region may be greater than the conductivity of the second region, and the first region may substantially serve as an electrode or a signal line. The second region may substantially correspond to an active region (or a channel) of a transistor. In other words, a portion of a semiconductor pattern may be an active region of a transistor, another portion thereof may be a source or a drain of the transistor, and the other portion thereof may be a connection electrode or a connection signal line.

A source region SE1 (or a source), an active region AC1 (or a channel), and a drain region DE1 (or a drain) of the silicon thin film transistor S-TFT may be formed from the first semiconductor pattern. The source region SE1 and the drain region DE1 may be extended in opposite directions from the active region AC1 on a cross section.

A first insulation layer 10 may be disposed on the buffer layer 10*br*. The first insulation layer 10 commonly overlaps a plurality of pixels in a plan view, and may cover the first semiconductor pattern. The first insulation layer 10 may be an inorganic layer and/or an organic layer, and may have a single-layered structure or a multi-layered structure. The first insulation layer 10 may include at least one of aluminum oxide, titanium oxide, silicon oxide, silicon nitride, silicon oxynitride, zirconium oxide, or hafnium oxide. In the present embodiment, the first insulation layer 10 may be a silicon oxide layer of a single layer. Not only the first insulation layer 10 but also an insulation layer of the circuit layer 120 to be described later may be an inorganic layer and/or an organic layer, and may have a single-layered structure or a multi-layered structure. The inorganic layer may include at least one of the above-described materials, but the embodiment of the invention is not limited thereto.

A gate GT1 of the silicon thin film transistor S-TFT is disposed above the first insulation layer 10. The gate GT1 may be a portion of a metal pattern. The gate GT1 overlaps the active region AC1 in a plan view. In a process of doping the first semiconductor pattern, the gate GT1 may function as a mask. The gate GT1 may include titanium (Ti), silver (Ag), an alloy containing silver, molybdenum (Mo), an alloy containing molybdenum, aluminum (Al), an alloy containing aluminum, aluminum nitride (AlN), tungsten (W), tungsten nitride (WN), copper (Cu), indium tin oxide (ITO), indium zinc oxide (IZO), or the like, but is not particularly limited thereto.

The second insulation layer 20 is disposed above the first insulation layer 10, and may cover the gate GT1. The third insulation layer 30 may be disposed above the second insulation layer 20. The second capacitor electrode CE20 of the storage capacitor Cst may be disposed between the second insulation layer 20 and the third insulation layer 30. In addition, the first capacitor electrode CE10 of the storage capacitor Cst may be disposed between the first insulation layer 10 and the second insulation layer 20.

A second semiconductor pattern may be disposed above the third insulation layer 30. The second semiconductor pattern may include an oxide semiconductor. The oxide semiconductor may include a plurality of regions distinguished according to whether a metal oxide has been reduced or not. A region in which the metal oxide has been reduced (hereinafter, a reduction region) has greater conductivity than a region in which the metal oxide has not been reduced (hereinafter, a non-reduction region). The reduction region substantially serves as a source/drain or signal line of a transistor. The non-reduction region substantially corresponds to a semiconductor region (or a channel) of a transistor. In other words, a portion of a semiconductor pattern may be a semiconductor region of a transistor, another portion thereof may be a source/drain of the transistor, and the other portion thereof may be a signal transmission region.

A source region SE2 (or a source), an active region AC2 (or a channel), and a drain region DE2 (or a drain) of the oxide thin film transistor O-TFT may be formed from the second semiconductor pattern. The source region SE2 and the drain region DE2 may be extended in opposite directions from the active region AC2 on a cross section.

A fourth insulation layer 40 may be disposed above the third insulation layer 30. The fourth insulation layer 40 commonly overlaps a plurality of pixels in a plan view, and may cover the second semiconductor pattern. The gate GT2 of the oxide thin film transistor O-TFT is disposed above the fourth insulation layer 40. The gate GT2 of the oxide thin film transistor O-TFT may be a portion of a metal pattern. The gate GT2 of the oxide thin film transistor O-TFT overlaps the active region AC2 in a plan view.

A fifth insulation layer 50 is disposed above the fourth insulation layer 40, and may cover the gate GT2. A first connection electrode CNE1 may be disposed above the fifth insulation layer 50. The first connection electrode CNE1 may be connected to the drain region DE1 of the silicon thin film transistor S-TFT through a contact hole passing through the first to fifth insulation layers 10, 20, 30, 40, and 50.

A sixth insulation layer 60 is disposed above the fifth insulation layer 50, and may cover the first connection electrode CNE1. A second connection electrode CNE2 may be disposed above the sixth insulation layer 60. The second connection electrode CNE2 may be connected to the first connection electrode CNE1 through a contact hole passing through the sixth insulation layer 60.

In the third region DP-A3, a seventh insulation layer 70 is disposed above the sixth insulation layer 60, and may cover the second connection electrode CNE2. An eighth insulation layer 80 may be disposed above the seventh insulation layer 70.

In the first and second regions DP-A1 and DP-A2, the seventh insulation layer 70 may be omitted. That is, the seventh insulation layer 70 overlaps the third region DP-A3, and may not overlap the first and second region DP-A1 and DP-A2 in a plan view. An eighth insulation layer 80 is disposed above the sixth insulation layer 60, and may cover the second connection electrode CNE2.

The first electrode AE1 of the first light emission element LD1 may be electrically connected to the first pixel circuit PC1 through a connection electrode CNE', the connection line TWL, a third connection electrode CNE3, and a fourth connection electrode CNE4. The connection line TWL and the third connection electrode CNE3 may be disposed between the fifth insulation layer 50 and the sixth insulation layer 60, but is not particularly limited thereto. The connection electrode CNE' and the fourth connection electrode CNE4 may be disposed between the sixth insulation layer 60 and the eighth insulation layer 80.

The sixth insulation layer 60 (or a third intermediate insulation layer), the seventh insulation layer 70 (or a second intermediate insulation layer), and the eighth insulation layer 80 (or a first intermediate insulation layer) may each be an organic layer. For example, the sixth insulation layer 60, the seventh insulation layer 70, and the eighth insulation layer 80 may each include a general purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The circuit layer 120 includes a compensation layer CML disposed in the first region DP-A1. Specifically, the compensation layer CML is disposed in a transmission region TA of the first region DP-A1 to be described later.

The compensation layer CML is disposed on the base layer 110. As an example, FIG. 8 illustrates that the compensation layer CML is disposed on the eighth insulation layer 80. The compensation layer CML may have a predetermined thickness HH in the third direction DR3. The circuit layer 120 may have a step in the circuit layer 120 by including the compensation layer CML.

The compensation layer CML may include a transparent insulation material. The compensation layer CML may be an organic layer. For example, the compensation layer CML may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

In an embodiment, the compensation layer CML may include the same material as a material of the eighth insulation layer 80, and the compensation layer CML may be formed by the same process as the process for forming the eighth insulation layer 80. For example, the compensation layer CML and the eighth insulation layer 80 may have the shape of a single body. However, the embodiment of the compensation layer CML is not limited thereto, and the compensation layer CML may be formed in the same layer with the seventh insulation layer 70, or may be disposed between the sixth insulation layer 60 and the eighth insulation layer 80 in another embodiment. A detailed description thereof will be followed.

The first light emission element LD1 may include the first electrode AE1 (or a pixel electrode), a light emission layer EL1 (or a first light emission layer), and a second electrode CE (or a common electrode), the second light emission element LD2 may include a first electrode AE2 (or a pixel electrode), a light emission layer EL2 (or a second light emission layer), and the second electrode CE (or a common electrode), and the third light emission element LD3 may include a first electrode AE3 (or a pixel electrode), a light emission layer EL3 (or a third light emission layer), and the second electrode CE (or a common electrode). The second electrode CE2 of the first light emission element LD1, the second light emission element LD2, and the third light emission element LD3 have the shape of a single body, and thus, may be commonly provided.

The first electrode AE1 of the first light emission element LD1, the first electrode AE2 of the second light emission element LD2, and the first electrode AE3 of the third light emission element LD3 may be disposed above the eighth insulation layer 80. The first electrode AE1 of the first light emission element LD1, the first electrode AE2 of the second light emission element LD2, and the first electrode AE3 of the third light emission element LD3 may each be a (semi) transmissive electrode or a reflective electrode. According to an embodiment of the invention, the first electrode AE1 of the first light emission element LD1, the first electrode AE2 of the second light emission element LD2, and the first electrode AE3 of the third light emission element LD3 may each include a reflective layer formed of Ag, Mg, Al, Pt, Pd, Au, Ni, Nd, Ir, Cr, or a compound thereof, and a transparent or translucent electrode layer formed on the reflective layer. The transparent or translucent electrode layer may be provided with at least one selected from the group consisting of indium tin oxide (ITO), indium zinc oxide (IZO), indium gallium zinc oxide ("IGZO"), zinc oxide (ZnO) or indium oxide ($In_2O_3$), and aluminum-doped zinc oxide ("AZO"). For example, the first electrode AE1 of the first light emission element LD1, the first electrode AE2 of the second light emission element LD2, and the first electrode AE3 of the third light emission element LD3 may each include a stacked structure of ITO/Ag/ITO.

The pixel definition film PDL and a pixel definition pattern PDP may be disposed above the eighth insulation layer 80. The pixel definition film PDL and the pixel definition pattern PDP include the same material, and may be formed through the same process. The pixel definition film PDL and the pixel definition pattern PDP may each have properties of adsorbing light. For example, the pixel definition film PDL and the pixel definition pattern PDP may each have a color of black. The pixel definition film PDL and the pixel definition pattern PDP may each include a black coloring agent. The black coloring agent may include a black dye and a black pigment. The black coloring agent may include carbon black, a metal such as chromium, or an oxide thereof. The pixel definition film PDL and the pixel definition pattern PDP may each correspond to a light blocking pattern having light blocking properties.

The pixel definition pattern PDP may be disposed in the first region DP-A1. The pixel definition pattern PDP may expose at least a portion of the first electrode AE1 of the first light emission element LD1. Specifically, the pixel definition pattern PDP may cover a portion of the first electrode AE1 of the first light emission element LD1. For example, the pixel definition pattern PDP may cover an edge of the first electrode AE1 of the first light emission element LD1.

The pixel definition film PDL may be disposed in the second region DP-A2 and in the third region DP-A3. The pixel definition film PDL may cover a portion of each of the first electrode AE2 of the second light emission element LD2 and the first electrode AE3 of the third light emission element LD3. For example, in the pixel definition film PDL, a first pixel opening PDL-OP1 which exposes a portion of the first electrode AE2 of the second light emission element LD2 and a second pixel opening PDL-OP2 which exposes a portion of the first electrode AE3 of the third light emission element LD3 may be defined.

The pixel definition pattern PDP may increase the distance between the edge of the first electrode AE1 of the first light emission element LD1 and the second electrode CE thereof, and the pixel definition film PDL may increase the distance between an edge of each of the first electrode AE2 of the second light emission element LD2 and the first electrode AE3 of the third light emission element LD3 and the second electrode CE thereof. Therefore, the pixel definition pattern PDP and the pixel definition film PDL may serve to prevent arcs and the like from occurring at the edge of each of the first electrodes AE1, AE2, and AE3.

In the first region DP-A1, a region overlapping a portion in which the first electrode AE1 of the first light emission element LD1 and the pixel definition pattern PDP are disposed in a plan view may be defined as an element region EA, and the remaining region may be defined as the transmission region TA.

The first spacer PSC1 described above with reference to FIG. 6 is disposed in the transmission region TA. The first spacer SPC1 includes a transparent insulation material, and thus, does not correspond to a light blocking structure.

The first spacer SPC1 is disposed on the circuit layer 120, and is disposed overlapping the compensation layer CML in a plan view. That is, the first spacer SPC1 is disposed in an upper portion of the compensation layer CML to overlap the compensation layer CML.

The compensation layer CML may not overlap at least a portion of the transmission region TA in a plan view. The first spacer SPC1 is disposed on the upper portion of the compensation layer CML, and thus, may have a height greater than a height of the periphery of the first spacer SPC1 in the transmission region TA. The first spacer SPC1 may have the greatest height in the transmission region TA. In the present specification, the height is a value measured in the third direction DR3 using the upper surface of the base layer 110 as a reference surface.

In an embodiment, the first spacer SPC1 may be disposed in contact with the circuit layer 120. FIG. 8 illustrates that the compensation layer CML is disposed on the eighth insulation layer 80, and the first spacer SPC1 is disposed in contact with the compensation layer CML. However, the embodiment of the invention is not limited thereto. In an embodiment of the invention, the compensation layer CML may be disposed on a lower portion of the eighth insulation layer 80.

A second spacer SPC2 may be disposed in the element region EA. The second spacer SPC2 may be disposed on the pixel definition pattern PDP. Specifically, the second spacer SPC2 may be disposed on an upper surface of the pixel definition pattern PDP.

Most of the upper surface of the pixel definition pattern PDP is covered by the second spacer SPC2, and an edge of the second spacer SPC2 has a structure of being spaced apart from an edge of the pixel definition pattern PDP, so that a portion of the pixel definition pattern PDP may be exposed from the second spacer SPC2. The second spacer SPC2 may improve the adhesion between the pixel definition pattern PDP and the second electrode CE.

The thickness of the second spacer SPC2 may be less than the thickness of the first spacer SPC1. In the present specification, the thickness is a value measured in the third direction DR3. For example, the thickness of the first spacer SPC1 may be about 1.5 times to about 2.5 times the thickness of the second spacer SPC2, and preferably, may be about 2 times or more. The second spacer SPC2 may include the same material as a material of the first spacer SPC1, and may be formed by the same process as the process for forming the first spacer SPC1. For example, the first spacer SPC1 and the second spacer SPC2 may be formed of a positive-type photosensitive organic material, and as an example, a photosensitive polyimide ("PSPI") may be used. Since the first spacer SPC1 and the second spacer SPC2 have positive properties, in a process for manufacturing the display device DD, portions of the first spacer SPC1 and the second spacer SPC2 not covered by a mask may be removed. The first spacer SPC1 and the second spacer SPC2 have transparency, so that light may be transmitted and/or reflected.

As described with reference to FIG. 6, the third spacer SPC3 may be disposed spaced apart at predetermined intervals in the second region DP-A2 and in the third region DP-A3. The third spacer SPC3 is disposed on an upper surface of the pixel definition film PDL. FIG. 7 illustrates the third spacer SPC3 and a 3-2 spacer SPC3-2, and FIG. 8 illustrates only the 3-2 spacer SPC3-2, but in other portions of the second region DP-A2, the third spacer SPC3 may be disposed as shown in FIG. 7.

Referring to FIG. 7, the third spacer SPC3 may include a structure of having a step. The third spacer SPC3 of an embodiment may include a 3-1 spacer SPC3-1 and the 3-2 spacer SPC3-2 having the height less than a height of the 3-1 spacer SPC3-1. The 3-1 spacer SPC3-1 and the 3-2 spacer SPC3-2 may have the shape of a single body.

The 3-1 spacer SPC3-1 and the 3-2 spacer SPC3-2 are formed of the same material, and may have the same material as those of the first and second spacers SPC1 and SPC2. For example, the 3-1 spacer SPC3-1 and the 3-2 spacer SPC3-2 may be formed of a positive-type photosensitive organic material, and have transparency, so that light may be transmitted and/or reflected. The 3-1 spacer SPC3-1 may serve to secure rigidity to pressing pressure by enhancing scratch strength. The 3-2 spacer SPC3-2 may serve as contact assistance between the pixel definition film PDL and the third light emission layer EL3 on an upper portion. For convenience, FIG. 7 and FIG. 8 illustrate that the light emission layers EL2 and EL3 and the second electrode CE are disposed on the second spacer SPC2 and the third spacer SPC3, but the embodiment of the invention is not limited thereto. A hole transport region and an electron transport region may be further disposed on the second spacer SPC2 and the third spacer SPC3.

Most of the upper surface of the pixel definition film PDL is covered by the third spacer SPC3, and an edge of the 3-2 spacer SPC3-2 has a structure of being spaced apart from an edge of the pixel definition film PDL, so that a portion of the pixel definition film PDL may be exposed from the third spacer SPC3.

When the 3-1 spacer SPC3-1 is not disposed on the upper surface of the pixel definition film PDL, the 3-2 spacer SPC3-2 may cover the upper surface of the pixel definition film PDL to enhance the adhesion properties between the pixel definition film PDL and the light emission layer EL3.

The thickness of the 3-1 spacer SPC3-1 may be about 2 times the thickness of the 3-2 spacer SPC3-2. The thickness of the 3-2 spacer SPC3-2 may be same as the thickness of the second spacer SPC2 described above.

The encapsulation layer 140 may be disposed above the light emission element layer 130. The encapsulation layer 140 may include a first inorganic layer 141, an organic layer 142, and a second inorganic layer 143 sequentially stacked, but layers constituting the encapsulation layer 140 are not limited thereto.

The first and second inorganic layers 141 and 143 may protect the light emission element layer 130 from moisture and oxygen, and the organic layer 142 may protect the light emission element layer 130 from foreign materials such as dust particles. The first and second inorganic layers 141 and 143 may include a silicon nitride layer, a silicon oxynitride layer, a silicon oxide layer, a titanium oxide layer, an aluminum oxide layer, or the like. The organic layer 142 may include an acrylic organic layer, but is not limited thereto.

The sensor layer 200 may be disposed above the display panel 100. The sensor layer 200 may be referred to as a sensor, an input sensing layer, or an input sensing panel. The sensor layer 200 may include a base insulation layer 210, a first conductive layer 220, a sensing insulation layer 230, a second conductive layer 240.

The base insulation layer 210 may be directly disposed above the display panel 100. The base insulation layer 210 may be an inorganic layer including at least one of silicon nitride, silicon oxynitride, or silicon oxide. Alternatively, the base insulation layer 210 may be an organic layer including an epoxy resin, an acrylic resin, or an imide-based resin. The base insulation layer 210 may have a single-layered structure, or a multi-layered structure in which layers are stacked along the third direction DR3.

Each of the first conductive layer 220 and the second conductive layer 240 may have a single-layered structure, or a multi-layered structure in which layers are stacked along the third direction DR3. The first conductive layer 220 and the second conductive layer 240 may include conductive lines defining a mesh-shaped sensing electrode. The conductive lines do not overlap the first pixel opening PDL-OP1, the second pixel opening PDL-OP2, and a third pixel opening PDL-OP (see FIG. 9), and overlaps the pixel definition pattern PDP and the pixel definition film PDL. The sensing electrode defined by the first conductive layer 220 and the second conductive layer 240 overlaps at least the third region DP-A3 illustrated in FIG. 5 in a plan view.

A conductive layer of a single-layered structure may include a metal layer or a transparent conductive layer. The metal layer may include molybdenum, silver, titanium, copper, aluminum, or an alloy thereof. The transparent conductive layer may include a transparent conductive oxide such as indium tin oxide (ITO), indium zinc oxide (IZO), zinc oxide (ZnO), indium tin zinc oxide (ITZO), or the like. In addition, the transparent conductive layer may include a conductive polymer such as PEDOT, a metal nanowire, graphene, or the like.

A conductive layer of a multi-layered structure may include metal layers. The metal layers may have, for example, a three-layered structure of titanium/aluminum/titanium. The conductive layer of a multi-layered structure may include at least one metal layer and at least one transparent conductive layer.

The sensing insulation layer 230 may be disposed between the first conductive layer 220 and the second conductive layer 240. The sensing insulation layer 230 may include an inorganic film. The inorganic film may include at least one of aluminum oxide, titanium oxide, silicon oxide, silicon nitride, silicon oxynitride, zirconium oxide, or hafnium oxide.

Alternatively, the sensing insulation layer 230 may include an organic film. The organic film may include at least any one among an acrylic resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

The reflection prevention layer 300 may be disposed above the sensor layer 200. The reflection prevention layer 300 may include a partition layer 310, a first color filter 321, a second color filter 322, a third color filter 323, and a planarization layer 330.

A material constituting the partition layer 310 is not particularly limited as long as it is a material which absorbs light. The partition layer 310 is a layer having a black color, and in an embodiment, the partition layer 310 may include a black coloring agent. The black coloring agent may include a black dye and a black pigment. The black coloring agent may include carbon black, a metal such as chromium, or an oxide thereof.

The partition layer 310 may cover the second conductive layer 240 of the sensor layer 200. The partition layer 310 may prevent external light reflection by silver second conductive layer 240. The partition layer 310 overlaps the second region DP-A2 and the third region DP-A3, and may not overlap the first region DP-A1 in a plan view. That is, since the partition layer 310 is not disposed in the first region DP-A1, the light transmittance of the first region DP-A1 may be further improved.

A plurality of openings 310-OP1 and 310-OP2 may be defined on the partition layer 310. A first opening 310-OP1 may overlap the first electrode AE2 of the second light emission element LD2, and a second opening 310-OP2 may overlap the first electrode AE3 of the third light emission element LD3 in a plan view.

The first color filter 321 may overlap the first region DP-A1, the second color filter 322 may overlap the second region DP-A2, and the third color filter 323 may overlap the third region DP-A3 in a plan view. The first color filter 321, the second color filter 322, and the third color filter 323 may overlap a corresponding electrode among the first electrodes AE1, AE2, and AE3, respectively.

Since the partition layer 310 does not overlap the first region DP-A1, the first color filter 321 may be spaced apart from the partition layer 310. That is, the first color filter 321 may not be in contact with the partition layer 310. The second color filter 322 may cover the first opening 310-OP1, and the third color filter 323 may cover the second opening 310-OP2. The second color filter 322 and the third color filter 323 may each be in contact with the partition layer 310. The opening area of the first and second openings 310-OP1 and 310-OP2 of the partition layer 310 may be greater than the opening area of the first and second openings PDL-OP1 and PDL-OP2 of the pixel definition film PDL.

The planarization layer 330 may cover the partition layer 310, the first color filter 321, the second color filter 322, and the third color filter 323. The planarization layer 330 may include an organic substance, and a flat surface may be provided on an upper surface of the planarization layer 330. In an embodiment of the invention, the planarization layer 330 may be omitted.

In addition to FIG. 7 and FIG. 8, FIG. 10 to FIG. 12 illustrate that the reflection prevention layer 300 includes the partition layer 310, the first color filter 321, the second color filter 322, the third color filter 323, and the planarization layer 330, but the invention is not limited thereto. In another embodiment of the invention, the reflection prevention layer 300 may include a reflection adjustment layer disposed on the partition layer 310 instead of the first to third color filters 321, 322, and 323. The reflection adjustment layer may selectively absorb light of some bands among light reflected from inside a display panel and/or an electronic device or light incident from outside the display panel and/or the electronic device.

For example, the reflection adjustment layer may be present on the plurality of openings 310-OP1 and 310-OP2 defined on the partition layer 310. As an example, the reflection adjustment layer may absorb light of a first wavelength region of about 490 nm to about 505 nm and light of a second wavelength region of about 585 nm to about 600 nm to be provided to have a light transmittance of about 40% or less in the first wavelength region and in the second wavelength region. The reflection adjustment layer may absorb light of a wavelength which is out of wavelength ranges of red, green, and blue light among light emitted from the first to third light emission elements LD1, LD2, and LD3. Since the reflection adjustment layer absorbs light of a wavelength which does not belong to wavelength ranges of red, green, and blue light emitted from the first to third light emission elements LD1, LD2, and LD3, the decrease in the luminance of the display panel 100 and/or the electronic device 1000 may be prevented or reduced to a minimum. At the same time, the degradation in the luminescence efficiency of the display panel 100 and/or the electronic device 1000 may be prevented or reduced to a minimum to improve visibility.

The reflection adjustment layer may be provided as an organic material layer including a dye, a pigment, or a combination thereof. The reflection adjustment layer include a tetra aza porphyrin("TAP")-based compound, a porphyrin-based compound, a metal porphyrin-based compound, an oxazine-based compound, a squarylium-based compound, a triarylmethane-based compound, a polymethine-based compound, an anthraquinone-based compound, a phthalocyanine-based compound, an azo-based compound, a perylene-based compound, a xanthene-based compound, a diimmonium-based compound, a dipyrromethene-based compound, a cyanine-based compound, and a combination thereof.

In an embodiment, the reflection adjustment layer may have a light transmittance of about 64% to about 72%. The light transmittance of the reflection adjustment layer may be adjusted according to the content of a pigment and/or a dye included in the reflection adjustment layer. The reflection adjustment layer may overlap the first to third light emission elements LD1, LD2, and LD3 on a plane (in a plan view).

When the display panel 100 includes the reflection adjustment layer, the display panel 100 may further include a capping layer and a low reflection layer between the second electrode CE and the encapsulation layer 140.

The capping layer may serve to improve the luminescence efficiency of a display element by the principle of constructive interference. The capping layer may include a material having a refractive index of about 1.6 or greater for light having a wavelength of, for example, about 589 nm.

The capping layer may be an organic capping layer including an organic substance, an inorganic capping layer including an inorganic substance, or a composite capping layer including an organic substance and an inorganic substance. For example, the capping layer may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

The low reflection layer may be disposed on the capping layer. The low reflection layer may include an inorganic material having a low reflectance, and may include a metal or a metal oxide in an embodiment. When the low reflection layer includes a metal, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof may be included. In addition, when the low reflection layer includes a metal oxide, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof may be included.

In an embodiment, the absorption coefficient (k) of the inorganic material included in the low reflection layer may be about 4.0 to about 0.5 ($0.5<k\leq4.0$). In addition, the refractive index (n) of the inorganic material included in the low reflection layer may be about 1 or greater ($n>1.0$).

The low reflection layer may induce destructive interference between light incident into a display panel and/or an electronic device and light reflected from a metal disposed on a lower portion of the low reflection layer, thereby reducing external light reflectance. Therefore, the display quality and visibility of the display panel and/or the electronic device may be improved.

Depending on embodiments, the capping layer may be omitted and the low reflection layer may be in contact with the second electrode CE.

Figure 9:
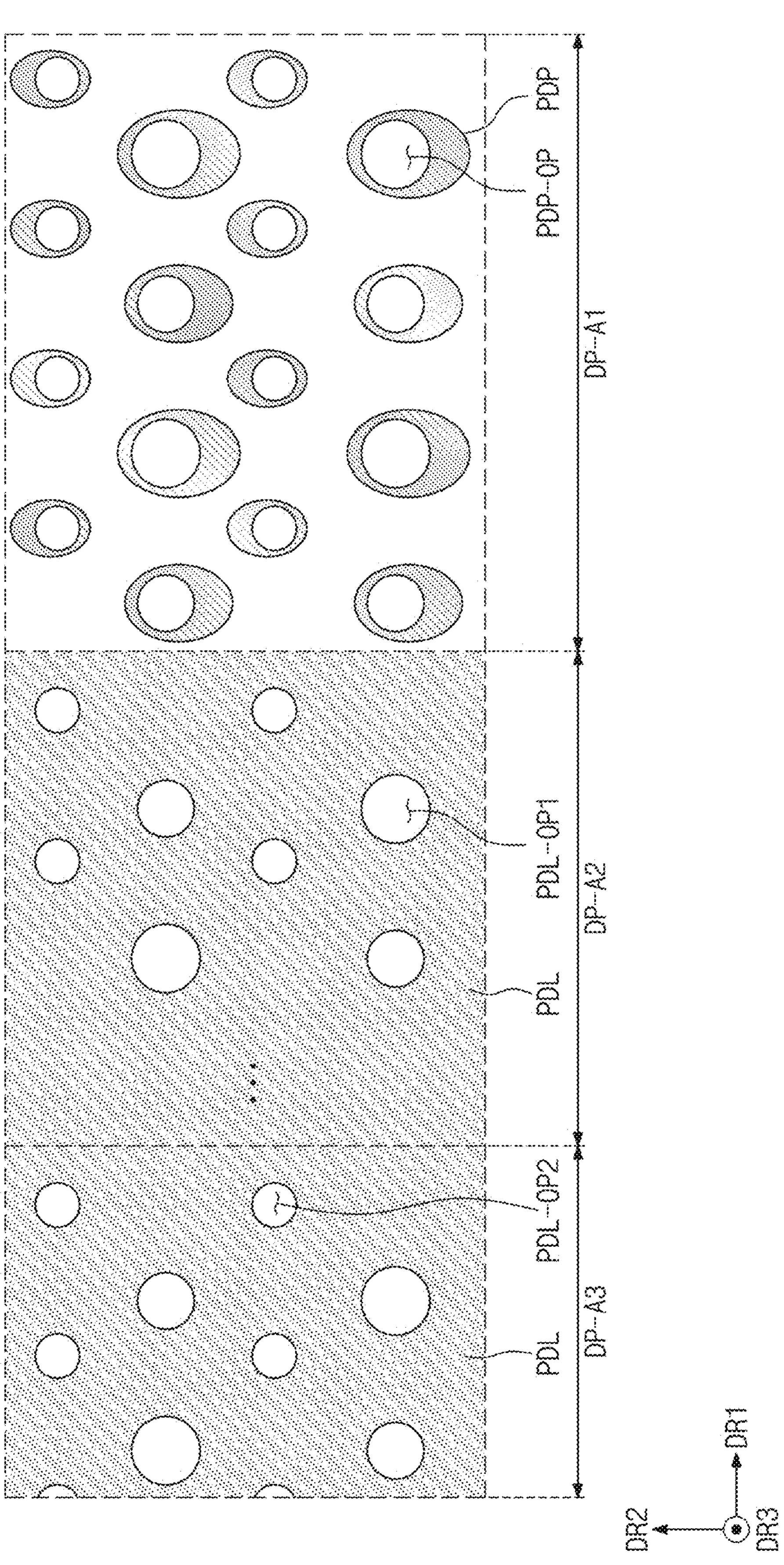
FIG. 9 is a plan view illustrating a pixel definition film and a pixel definition pattern according to an embodiment of the invention.

FIG. 9 is a plan view illustrating the pixel definition film PDL and the pixel definition pattern PDP according to an embodiment of the invention. Specifically, FIG. 9 illustrates the pixel definition film PDL and the pixel definition pattern PDP disposed in a portion corresponding to region AA' of FIG. 5.

Referring of FIG. 9, the pixel definition film PDL may be disposed in the second region DP-A2 and in the third region DP-A3. The pixel definition film PDL may not overlap the first region DP-A1 in a plan view. As illustrated in FIG. 9, in the first region DP-A1, instead of the pixel definition film PDL, a ring-shaped pixel definition pattern PDP may be disposed only in a portion of the first region DP-A1 to improve the light transmittance of the first region DP-A1.

In the first region DP-A1, the pixel definition pattern PDP may be disposed. The pixel definition pattern PDP may be provided in plurality, and the plurality of pixel definition patterns PDP may be disposed spaced apart from each other. In the pixel definition pattern PDP, the third pixel opening PDP-OP may be defined. The third pixel opening PDP-OP overlaps the first electrode AE1 (see FIG. 8) of the first light emission element LD1 (see FIG. 8). For example, the pixel definition pattern PDP may have a shape which covers the edge of the first electrode AE1 (see FIG. 8). Therefore, when viewed in a plan view, the pixel definition pattern PDP may have a ring shape or a donut shape. However, the shape of the pixel definition pattern PDP on a plane (i.e., in a plan view) is not limited thereto.

In the second region DP-A2, the first pixel opening PDL-OP1 is arranged by predetermined rule. The arrangement of the first pixel opening PDL-OP1 depends on the color arrangement of pixels. FIG. 9 exemplarily illustrates three types of first pixel openings PDL-OP1 distinguished by area. This means that pixels which generate three types of colors are arranged. The three types of pixels may include a red pixel, a green pixel, and a blue pixel.

FIG. 9 exemplarily illustrates three types of pixel definition patterns PDP distinguished by area. This means that pixels which generate three types of colors are arranged. The three types of pixels may include a red pixel, a green pixel, and a blue pixel.

However, the shapes of the pixel definition pattern PDP and the pixel definition film PDL are not limited thereto.

Figure 10:
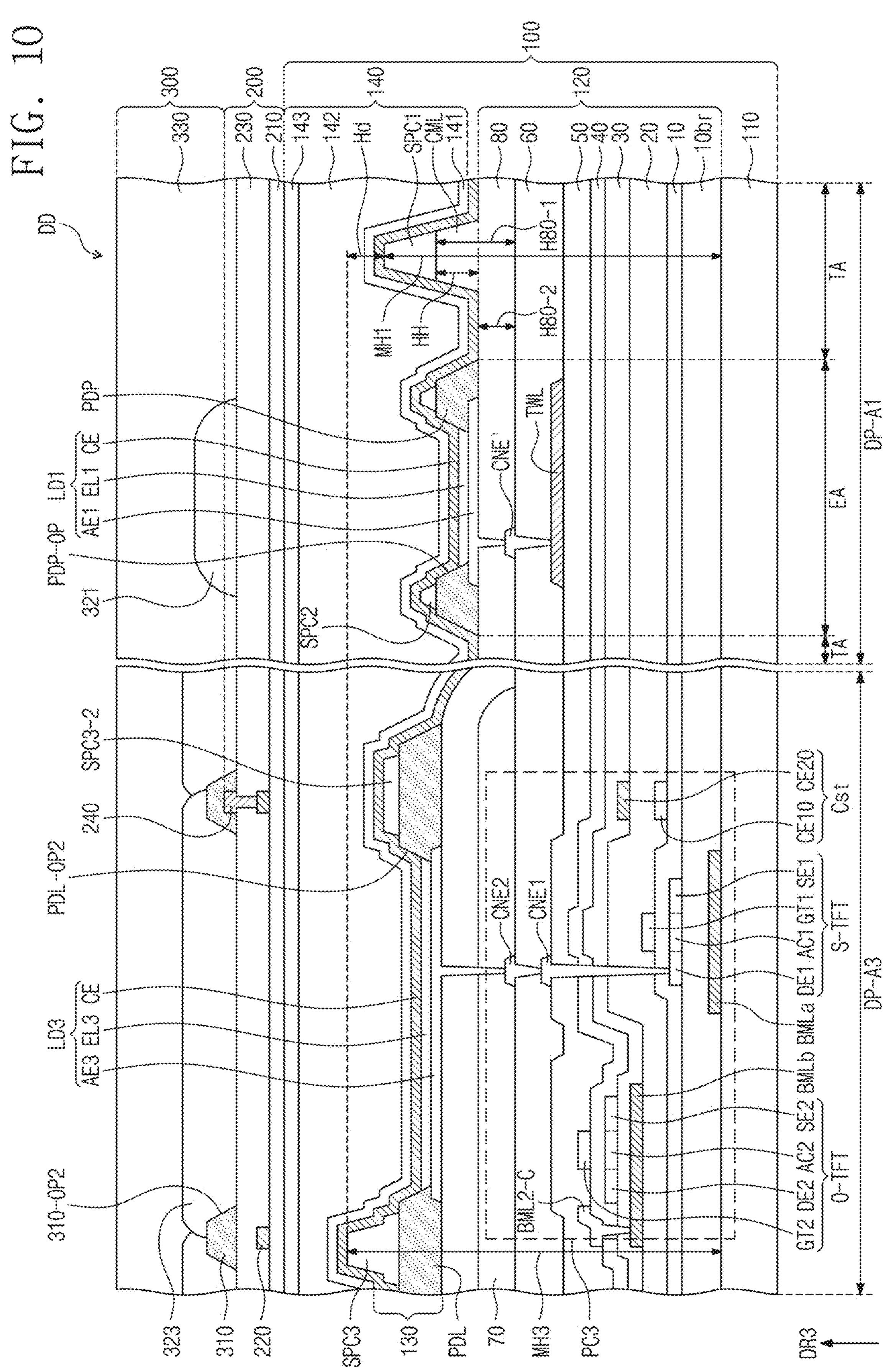
FIG. 10 is a cross-sectional view of a display device according to an embodiment of the invention.

FIG. 10 is a cross-sectional view of the display device DD according to an embodiment of the invention.

FIG. 10 illustrates an enlarged portion of each of the first region DP-A1 and the third region DP-A3.

Referring to FIG. 10, the seventh insulation layer 70 may not overlap the first region DP-A1, and may overlap the third region DP-A3 in a plan view.

Since the seventh insulation layer 70 is not disposed in the first region DP-A1, the thickness of the circuit layer 120 disposed in the transmission region TA may be reduced to a minimum. However, the embodiment of the invention is not limited thereto, and in another embodiment the seventh insulation layer 70 may overlap the first to third regions DP-A1, DP-A2, and DP-A3 in a plan view.

The compensation layer CML may be disposed on the eighth insulation layer 80. In an embodiment, the compensation layer CML may include the same material as a material of the eighth insulation layer 80. The compensation layer CML and the eighth insulation layer 80 may have the shape of a single body, and accordingly, the boundary line between the compensation layer CML and the eighth insulation layer 80 is indicated by a dotted line. It may be understood that the compensation layer CML is an 8-1 insulation layer, the eighth insulation layer 80 is an 8-2 insulation layer, and the 8-1 insulation layer and the 8-2 insulation layer form one insulation layer. The thickness HH of the compensation layer CML may be the same as a thickness H80-2 of the eighth insulation layer 80. When the eighth insulation layer 80 is formed, the eighth insulation layer 80 may be formed to a first thickness H80-1 in a lower portion of the first spacer SPC1, and the eighth insulation layer 80 may be formed to a second thickness H80-2, which is less than the first thickness H80-1, in a portion in which the first spacer SPC1 is not disposed. The first thickness H80-1 may be about 1.5 times to about 2.5 times the second thickness H80-2, and preferably, the first thickness H80-1 may be about 2 times the second thickness H80-2. For example, the first thickness H80-1 may be about 7500 angstroms (Å) to about 20000 Å, and the second thickness H80-2 may be about 5000 Å to about 8000 Å. For example, the first thickness H80-1 may be about 12000 Å, and the second thickness H80-2 may be about 6000 Å to about 7000 Å. In the lower portion of the first spacer SPC1, the eighth insulation layer 80 may be formed in a full tone, and in a portion in which the first spacer SPC1 is not disposed in the first to third regions DP-A1, DP-A2, and DP-A3 (see FIG. 7 and FIG. 8), the eighth insulation layer 80 may be formed in a half tone.

A maximum height MH3 of the third spacer SPC3 from the base layer 110 may be greater than a maximum height MH1 of the first spacer SPC1 from the base layer 110. Since the eighth insulation layer 80 overlapping the first spacer SPC1 in a plan view has the first thickness H80-1, a height difference Hd between the first spacer SPC1 disposed in the first region DP-A1 and the third spacer SPC3 disposed in the third region DP-A3 may be reduced to a minimum. Here, the height difference Hd corresponds to the maximum height MH3 and the maximum height MH1. Accordingly, the display panel 100 may provide a flat layer to structures formed on upper portions of the first spacer SPC1 and the third spacer SPC3.

In addition, since the eighth insulation layer 80 has the second thickness H80-2, which is less than the first thickness H80-1, in a portion not overlapping the first spacer SPC1 in a plan view, the overall thickness of the insulation layers 60, 70, and 80 including the eighth insulation layer 80 which are included in the circuit layer 120 may be reduced to a minimum. Accordingly, defects caused by the shrinkage of the eighth insulation layer 80 may be prevented or reduced to a minimum. In addition, since the thickness of at least a portion of the eighth insulation layer 80 disposed on the transmission region TA is reduced, the transmittance of light in the transmission region TA may also be improved. Accordingly, the reliability of the electronic device 1000 may be effectively improved.

Figure 11:
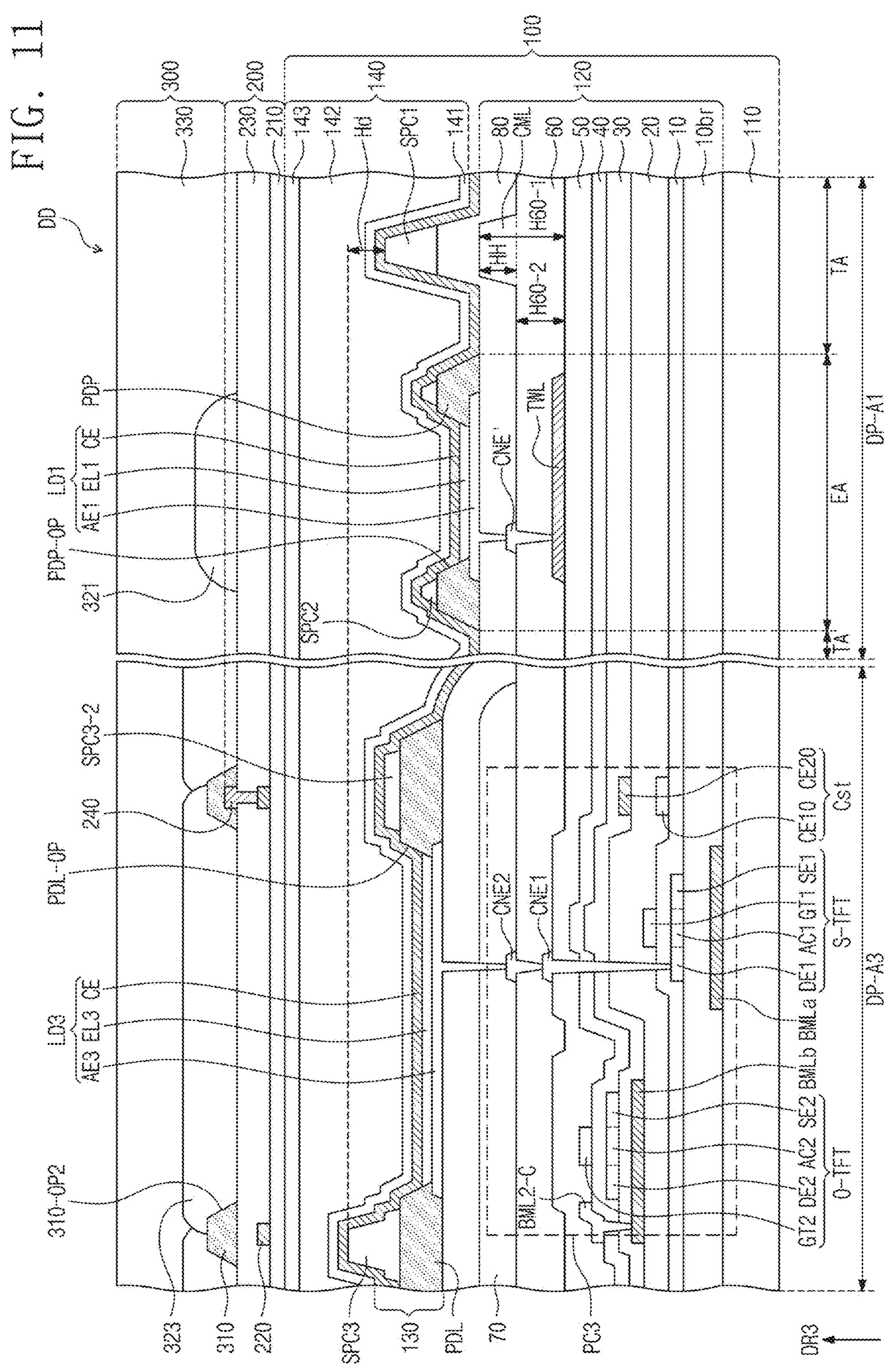
FIG. 11 is a cross-sectional view of a display device according to another embodiment of the invention.

FIG. 11 is a cross-sectional view of the display device DD according to another embodiment of the invention.

Referring to FIG. 11, the compensation layer CML of an embodiment may be disposed between the sixth insulation layer 60 and the eighth insulation layer 80. The compensation layer CML may include the same material as a material of the sixth insulation layer 60, and may be formed by the same process as the process for forming the sixth insulation layer 60. For example, the compensation layer CML and the sixth insulation layer 60 may have the shape of a single body, and accordingly, the boundary line between the compensation layer CML and the sixth insulation layer 60 is indicated by a dotted line. It may be understood that the compensation layer CML is a 6-1 insulation layer, the sixth insulation layer 60 is a 6-2 insulation layer, and the 6-1 insulation layer and the 6-2 insulation layer form one insulation layer. The thickness HH of the compensation layer CML may be the same as a thickness H60-2 of the sixth insulation layer 60. That is, when the sixth insulation layer 60 is formed, the sixth insulation layer 60 may be formed to a first thickness H60-1 in a lower portion of the first spacer SPC1, and the sixth insulation layer 60 may be formed to a second thickness H60-2, which is less than the first thickness H60-1, in a portion in which the first spacer SPC1 is not disposed. The first thickness H60-1 may be about 1.5 times to about 2.5 times the second thickness H60-2, and preferably, the first thickness H60-1 may be about 2 times the second thickness H60-2. For example, the first thickness H60-1 may be about 15000 Å to about 32500 Å, and the second thickness H80-2 may be about 10000 Å to about 13000 Å. For example, the first thickness H60-1 may be about 20000 Å, and the second thickness H60-2 may be about 11000 Å to about 12000 Å. In the lower portion of the first spacer SPC1, the sixth insulation layer 60 may be formed in a full tone, and in a portion in which the first spacer SPC1 is not disposed in the first to third regions DP-A1, DP-A2, and DP-A3 (see FIG. 7 and FIG. 8), the sixth insulation layer 60 may be formed in a half tone.

Since the sixth insulation layer 60 overlapping the first spacer SPC1 in a plan view has the first thickness H60-1, the height difference Hd between the first spacer SPC1 disposed in the first region DP-A1 and the third spacer SPC3 disposed in the third region DP-A3 may be reduced to a minimum. Accordingly, the display panel 100 may provide a flat layer to structures formed on upper portions of the first spacer SPC1 and the third spacer SPC3.

In addition, since the sixth insulation layer 60 has the second thickness H60-2, which is less than the first thickness H60-1, in a portion not overlapping the first spacer SPC1 in a plan view, the overall thickness of the insulation layers 60, 70, and 80 including the sixth insulation layer 60 which are included in the circuit layer 120 may be reduced to a minimum. Accordingly, defects caused by the shrinkage of the sixth insulation layer 60 may be prevented or reduced to a minimum. In addition, since the thickness of at least a portion of the sixth insulation layer 60 disposed on the transmission region TA is reduced, the transmittance of light in the transmission region TA may also be improved. Accordingly, the reliability of the electronic device 1000 may be improved.

Figure 12:
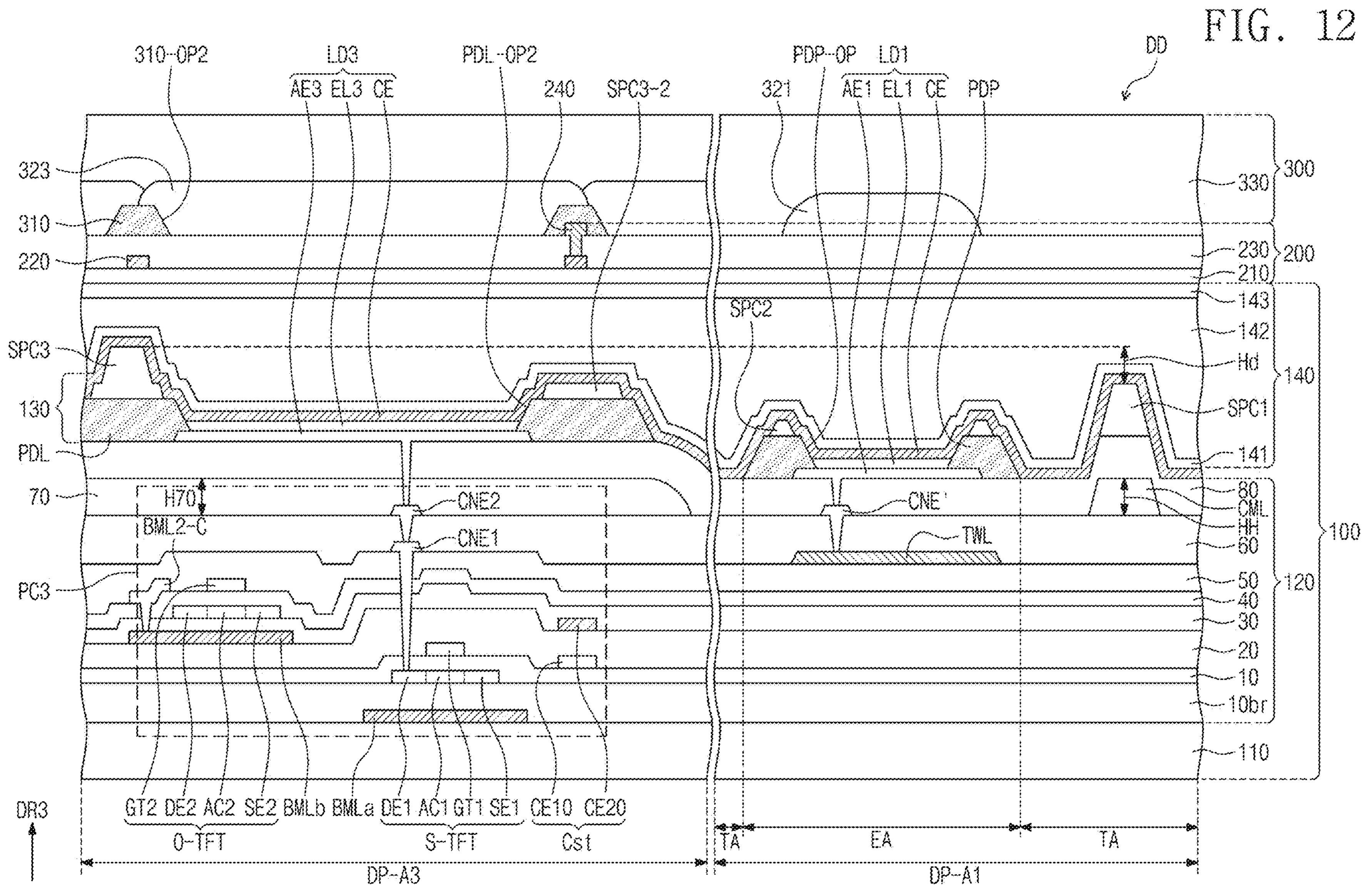
FIG. 12 is a cross-sectional view of a display device according to still another embodiment of the invention.

FIG. 12 is a cross-sectional view of the display device DD according to still another embodiment of the invention.

Referring to FIG. 12, the compensation layer CML of an embodiment may be disposed in the same layer as the seventh insulation layer 70. Since the seventh insulation layer 70 is not disposed in the first region DP-A1, the compensation layer CML may be spaced apart from the seventh insulation layer 70 and disposed in the transmission region TA. The compensation layer CML may include the same material as a material of the seventh insulation layer 70, and may be formed by the same process as the process for forming the seventh insulation layer 70. It may be understood that the compensation layer CML is a 7-1 insulation layer, the seventh insulation layer 70 is a 7-2 insulation layer, and the 7-1 insulation layer and the 7-2 insulation layer form one insulation layer. The thickness HH of the compensation layer CML may be the same as a thickness H70 of the seventh insulation layer 70. That is, when the seventh insulation layer 70 is formed, the seventh insulation layer 70 may be formed to the same thickness H70 in the lower portion of the first spacer SPC1 and in the third region DP-A3. The thickness H70 of the seventh insulation layer 70 may be about 15000 Å.

Since the seventh insulation layer 70 is disposed only in the lower portion of the first spacer SPC1 in the first region DP-A1, the height difference Hd between the first spacer SPC1 disposed in the first region DP-A1 and the third spacer SPC3 disposed in the third region DP-A3 may be reduced to a minimum. Accordingly, the display panel 100 may provide a flat layer to structures formed on upper portions of the first spacer SPC1 and the third spacer SPC3.

In addition, since the seventh insulation layer 70 is not disposed in a portion not overlapping the first spacer SPC1 in the first region DP-A1 in a plan view, the overall thickness of the insulation layers 60, 70, and 80 including the seventh insulation layer 70 which are included in the circuit layer 120 may be reduced to a minimum. Accordingly, defects caused by the shrinkage of the insulation layers 60, 70, and 80 may be prevented or reduced to a minimum. In addition, the transmittance of light in the transmission region TA may also be improved. Accordingly, the reliability of the electronic device 1000 may be improved.

Figure 13A:
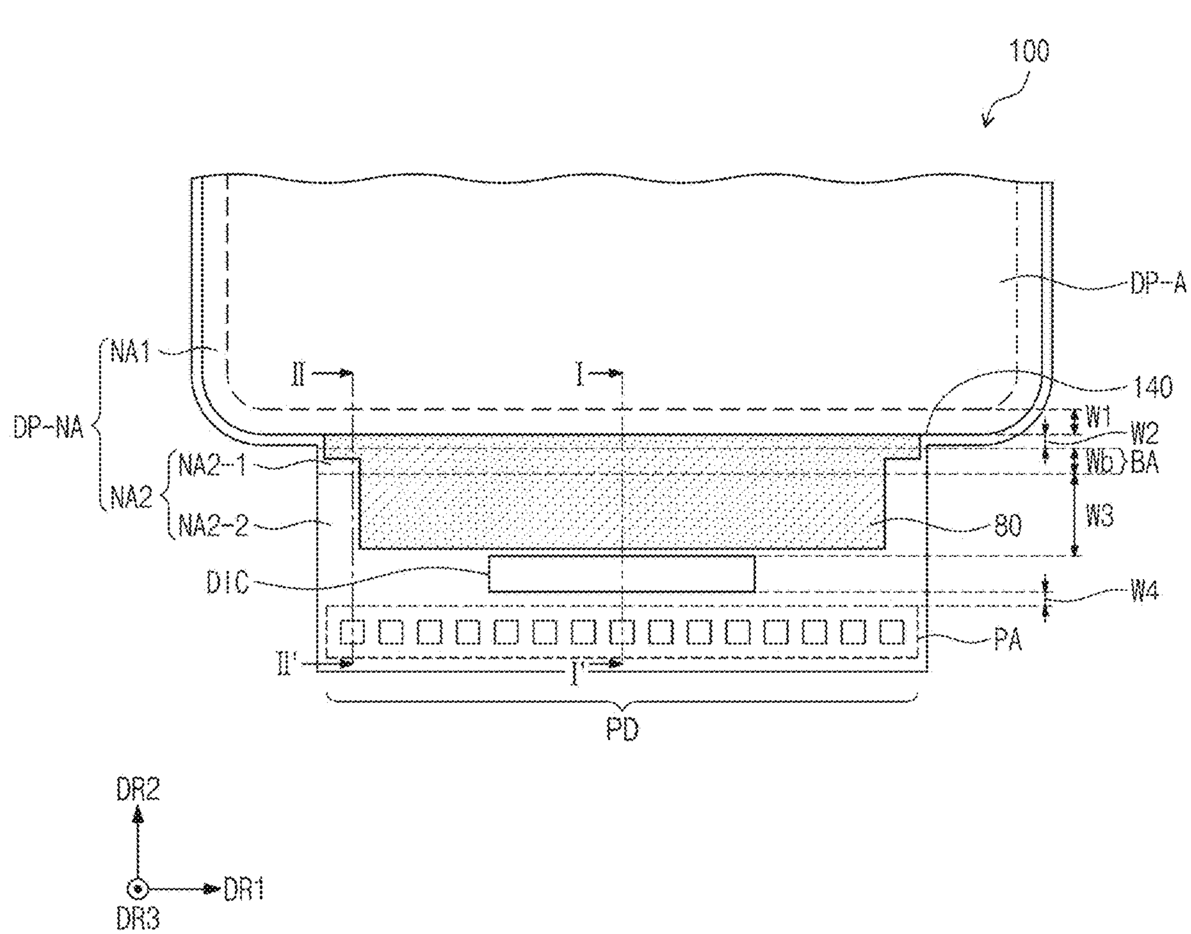
FIG. 13A is a view illustrating an enlarged portion of a display region and a peripheral region according to an embodiment of the invention.

FIG. 13A is a view illustrating an enlarged portion of a display region and a peripheral region according to an embodiment of the invention. FIG. 13A illustrates the display region DP-A and the peripheral region DP-NA of the display panel 100.

In an embodiment, the peripheral region DP-NA may include a first non-display region NA1 surrounding the display region DP-A and a second non-display region NA2 including the driving unit DIC, the pads PD, a connection line, and the bending region BA.

The first non-display region NA1 is positioned surrounding the outside of the display region DP-A, and represents from the position at which the display region DP-A ends to the position at which the encapsulation layer 140 extended from the display region DP-A ends. That is, the encapsulation layer 140 is formed in the display region DP-A and extended to the non-display region DP-NA, and may be extended between the bending region BA in the non-display region DP-NA and the display region DP-A. The non-display region DP-NA in which the encapsulation layer 140 is formed is defined as the first non-display region NA1.

The second non-display region NA2 may include a 2-1 non-display region NA2-1 and a 2-2 non-display region NA2-2 positioned on opposite sides around the bending region BA.

The 2-1 non-display region NA2-1 represents from the position at which the encapsulation layer ends 140 to the bending region BA, and the 2-2 non-display region NA2-2 may include from the end of the bending region BA past the driving unit DIC to one end of the display panel 100. In the 2-2 non-display region NA2-2, the driving unit DIC and the pads PD may be disposed. Below the driving unit DIC, a pad for a driving unit DIC-P (see FIG. 13B) for being electrically connected to the driving unit DIC in the form of a chip may be further disposed. To the pads PD (hereinafter, pads for a circuit board), an additional circuit board may be connected, and for example, a flexible printed circuit board may be electrically connected thereto.

In an embodiment, the first non-display region NA1 has a first width W1, and the 2-1 non-display region NA2-1 has a second width W2, and in the 2-2 non-display region NA2-2, a gap between the bending region BA and the driving unit DIC has a third width W3, and a gap between the driving unit DIC and the pad region PA has a fourth width W4. When a width Wb of the bending region BA is 1, the first width W1 may have a value of about 0.7 to about 0.9, the second width W2 may have a value of about 0.4 to about 0.6, the third width W3 may have a value of about 1.1 to about 1.5, and the fourth width W4 may have a value of about 0.3 to about 0.6. The width Wb of the bending region BA may vary depending on embodiments. For example, the width Wb of the bending region BA may be about 1000 micrometers (μm) to about 4000 μm. However, the embodiment of the invention is not limited thereto.

Figure 13B:
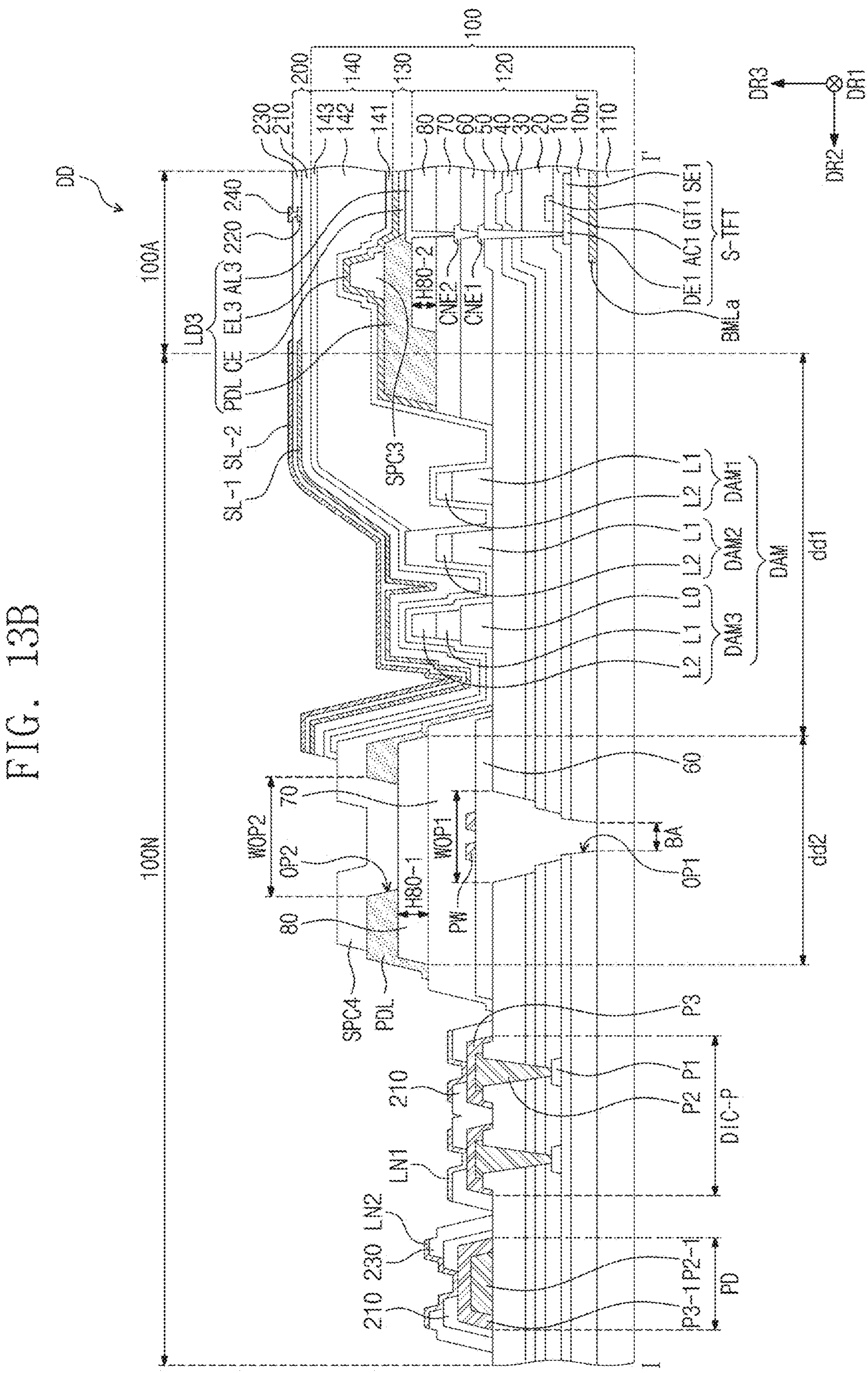
FIG. 13B is a cross-sectional view of a display device according to an embodiment of the invention.
Figure 13C:
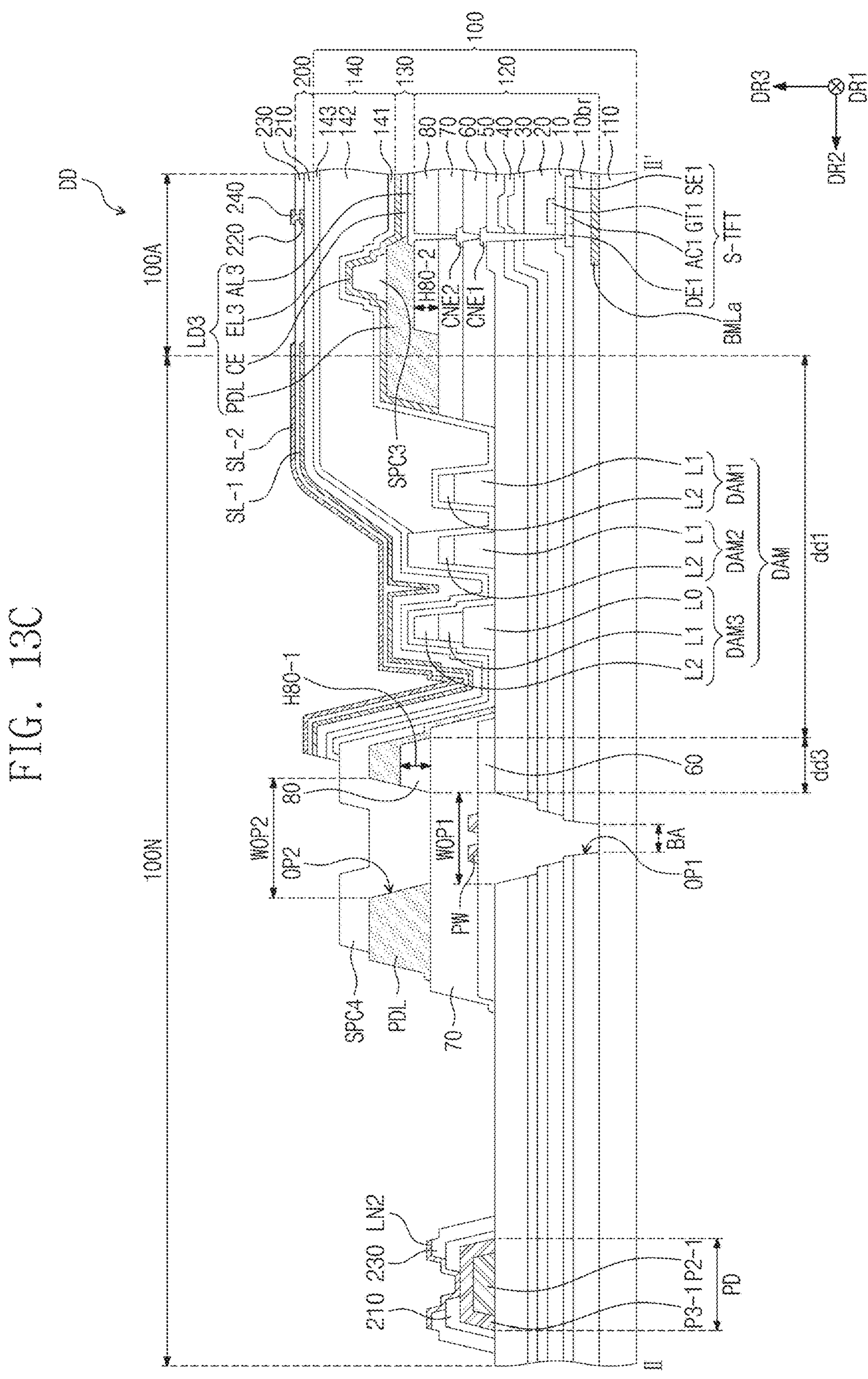
FIG. 13C is a cross-sectional view of a display device according to an embodiment of the invention.

FIG. 13B is a cross-sectional view of the display device DD according to an embodiment of the invention. FIG. 13C is a cross-sectional view of the display device DD according to an embodiment of the invention.

FIG. 13B illustrates a cross-sectional view of the display device DD including the display panel 100 taken along line I-I' of FIG. 13A. Hereinafter, the same contents will be equally applied to components which are same as those described with reference to FIG. 1 to FIG. 13A.

FIG. 13B illustrates the third light emission element LD3 disposed in the display region 100A, the silicon thin film transistor S-TFT of the third pixel circuit PC3 (see FIG. 7), and a dam, the signal lines SL1 and SL2, the pad for a driving unit DIC-P, and the pad for a circuit board PD which are disposed around the first rear metal layer BMLa and the peripheral region 100N. In the peripheral region 100N, the bending region BA may be defined between the dam structure DAM and the pad for a driving unit DIC-P.

The dam structure DAM is disposed outside the boundary of the display region 100A, and prevents the overflow of the organic layer 142. The dam structure DAM may be provided in plurality. The dam structure DAM may include a first dam DAM1, a second dam DAM2, and a third dam DAM3. The first to third dams DAM1, DAM2, and DAM3 are sequentially arranged along a direction away from the display region 100A. That is, the second dam DAM2 may be disposed further spaced apart from the display region 100A than the first dam DAM1 is, and the third dam DAM3 may be disposed further spaced apart from the display region 100A than the second dam DAM2 is.

Each of the first to third dams DAM1, DAM2, and DAM3 may include a plurality of layers. In an embodiment, each of the first to third dams DAM1, DAM2, and DAM3 includes a first layer L1 and a second layer L2, and the third dam DAM3 further includes a sub-layer L0 disposed below the first layer L1, and thus, may be higher than each of the first dam DAM1 and the second dam DAM2. The sub-layer L0 may be formed by the same process as the process for forming the sixth insulation layer 60, the first layer L1 may be formed by the same process as the process for forming the seventh insulation layer 70, and the second layer L2 may be formed by the same process as the process for forming a fourth spacer SPC4. In an embodiment, each of the first to third dams DAM1, DAM2, and DAM3 may not include the same material as a material of the eighth insulation layer 80.

On the first dam DAM1, the encapsulation layer 140 including the first inorganic layer 141, the organic layer 142, and the second inorganic layer 143, which are sequentially stacked, may be disposed. On the second dam DAM2, the encapsulation layer 140 has a structure in which the first inorganic layer 141 and the second inorganic layer 143 are in contact. The encapsulation layer 140 may be extended from the display region 100A to the peripheral region 100N to be disposed between the dam structure DAM and the bending region BA. The encapsulation layer 140 may not overlap the bending region BA in a plan view.

On the encapsulation layer 140, the sensor layer 200 may be disposed. In an embodiment, the sensor layer 200 may include the base insulation layer 210, the first conductive layer 220, the sensing insulation layer 230, the second conductive layer 240 which are disposed on the second inorganic layer 143. The base insulation layer 210 may be omitted. The sensor layer 200 may further include a first signal line SL-1 and a second signal line SL-2 disposed in the peripheral region 100N. The first signal line SL-1 is disposed in the same layer as the first conductive layer 220, and may include the same material as a material of the first conductive layer 220. The second signal line SL-2 is disposed in the same layer as the second conductive layer 240, and may include the same material as a material of the second conductive layer 240. Although not illustrated, a portion of the first signal line SL-1 and a portion of the second signal line SL-2 may be connected to each other through a contact hole defined in the sensing insulation layer 230. The first and second signal lines SL-1 and SL-2 may not overlap the bending region BA in a plan view.

In the bending region BA, the base layer 110, and the sixth insulation layer 60, the seventh insulation layer 70, the eighth insulation layer 80, and the fourth spacer SPC4 which are disposed on the base layer 110 may be disposed. In the bending region BA, a first opening OP1 passing through the buffer layer 10*br* and the first to fifth insulation layers 10, 20, 30, 40, and 50 may be defined. Accordingly, the bending region BA may not include an inorganic film. In addition, a second opening OP2 is defined on the pixel definition film PDL disposed on the eighth insulation layer 80, so that the bending region BA may not include the pixel definition film PDL. Between the sixth insulation layer 60 and the seventh insulation layer 70, a conductive layer PW overlapping the bending region BA in a plan view may be disposed. The conductive layer PW may be formed by the same process as the process for forming the second connection electrode CNE2. The conductive layer PW may be a line connecting a signal line disposed in the driving unit DIC (see FIG. 13A) and a signal line disposed in the display region DP-A (see FIG. 5). The fourth spacer SPC4 may be formed by the same process as the process for forming the third spacer SPC3. By the second opening OP2 formed on the pixel definition film PDL, the fourth spacer SPC4 may include a shape having a step.

The display device DD of the invention may include the eighth insulation layer 80 overlapping the bending region BA in a plan view and disposed in the peripheral region 100N. Specifically, the eighth insulation layer 80 disposed in the peripheral region 100N may be disposed spaced apart by a first length dd1 along the second direction DR2 from the display region 100A. For example, the first length dd1 may be about 704 μm to about 1056 μm. Specifically, the first length dd1 may be about 792 μm to about 968 μm, and the first length dd1 may be, for example, about 880 μm. However, the embodiment of the first length dd1 is not limited thereto.

The eighth insulation layer 80 disposed in the peripheral region 100N may be disposed spaced apart by a second length dd2 along the second direction DR2. For example, the second length dd2 may be about 4160 μm to about 6240 μm. Specifically, the second length dd2 may be about 4680 μm to about 5720 μm, and the second length dd2 may be, for example, about 5200 μm. However, the embodiment of the second length dd2 is not limited thereto.

Meanwhile, a first thickness H80-1 of the eighth insulation layer 80 disposed in the peripheral region 100N may be about 12000 Å. A second thickness H80-2 of the eighth insulation layer 80 disposed in the peripheral region 100N may be about 6000 Å. The first thickness H80-1 of the eighth insulation layer 80 disposed in the peripheral region 100N may be the same as the height of the eighth insulation layer 80 disposed in the transmission region TA (see FIG. 10) described above. The second thickness H80-2 of the eighth insulation layer 80 disposed in the display region 100A may be the same as the height of the eighth insulation layer 80 disposed in the third region DP-A3 (see FIG. 10) described above.

On the outside of the bending region BA, the pad for a driving unit DIC-P and the pad for a circuit board PD may be disposed. In an embodiment, the pad for a driving unit DIC-P may include a quadruple-layered structure. For example, the pad for a driving unit DIC-P may include a first pad electrode P1 including the same material as a material of the gate GT1 of the silicon thin film transistor S-TFT, a second pad electrode P2 including the same material as a material of the first connection electrode CNE1, a third pad electrode P3 including the same material as a material of the second connection electrode CNE2, and a fourth pad electrode LN1 including the same material as a material of the second signal line SL-2. Between the third pad electrode P3 and the fourth pad electrode LN1, the base insulation layer 210 may disposed. However, the embodiment of the invention is not limited thereto, and the pad for a driving unit DIC-P may have a double-layered structure or a triple-layered structure in another embodiment.

In an embodiment, the pad for a circuit board PD may include a triple-layered structure. For example, the pad for a circuit board PD may include a second pad electrode P2-1 including the same material as a material of the first connection electrode CNE1, a third pad electrode P3-1 including the same material as a material of the second connection electrode CNE2, and a fourth pad electrode LN2 including the same material as a material of the second signal line SL-2. Between the third pad electrode P3-1 and the fourth pad electrode LN2, the sensing insulation layer 230 may disposed. However, the embodiment of the invention is not limited thereto, and the pad for a circuit board PD may have a double-layered structure, at which time, the fourth pad electrode LN2 may be omitted in another embodiment.

FIG. 13C illustrates a cross-sectional view of the display device DD including the display panel 100 taken along line II-II' of FIG. 13A. Hereinafter, the same contents will be equally applied to components which are the same as those described with reference to FIG. 1 to FIG. 13A.

In the cross-sectional view of the display device DD taken along line II-II' the eighth insulation layer 80 disposed in the peripheral region 100N may be disposed spaced apart by the first length dd1 along the second direction DR2 from the display region 100A. The same contents described above with reference to FIG. 13B may be equally applied to the description of the first length dd1.

The eighth insulation layer 80 disposed in the peripheral region 100N may be disposed spaced apart by a third length dd3 along the second direction DR2. For example, the third length dd3 may be about 1201 μm to about 1802 μm. Specifically, the third length dd3 may be about 1352 μm to about 1652 μm, and the third length dd3 may be, for example, about 1502 μm. However, the embodiment of the third length dd3 is not limited thereto.

Meanwhile, the height H80-1 of the eighth insulation layer 80 disposed in the peripheral region 100N may be about 12000 Å. The height H80-2 of the eighth insulation layer 80 disposed in the peripheral region 100N may be about 6000 Å.

A display panel of the invention includes a first spacer disposed in a transmission region and a compensation layer overlapping the first spacer in a lower portion of the first spacer in a plan view, so that the difference in height between the first spacer disposed in the transmission region and a third spacer disposed in a general display region may be reduced to a minimum. In addition, the display panel of the invention does not include the compensation layer in a portion in which the first spacer is not disposed, so that the thickness of a circuit layer may be reduced to a minimum, and accordingly, defects caused by the shrinkage of the circuit layer may be reduced to a minimum, and the light transmittance of the circuit layer may be improved. Therefore, an electronic device including the display panel of the invention may have improved reliability.

A display panel of the present invention may have improved light transmittance by reducing the thickness of an insulation layer.

An electronic device of the present invention may improve the reliability of an electronic module.

Although the invention has been described with reference to a preferred embodiment of the invention, it will be understood by those skilled in the art that various changes in form and details may be made therein without departing from the spirit and scope of the invention as set forth in the following claims. Accordingly, the technical scope of the invention is not intended to be limited to the contents set forth in the detailed description of the specification, but is intended to be defined by the appended claims.

What is claimed is:

1. A display panel comprising:

a base layer including a first region;

a circuit layer including a first intermediate insulation layer disposed on the base layer and a compensation layer disposed on the base layer;

a light emission element layer including a first light emission element having a first electrode and disposed in the first region, and disposed on the circuit layer; and a first spacer disposed on the circuit layer, and overlapping the compensation layer in a plan view, wherein:

the first region includes an element region overlapping the first electrode and a transmission region not overlapping the first electrode; and the first spacer and the compensation layer are each disposed in the transmission region in the plan view, wherein the compensation layer comprises a same material as a material of the first intermediate insulation layer, and is disposed between the first intermediate insulation layer and the first spacer.

2. The display panel of claim 1, wherein a thickness of the compensation layer is substantially the same as a thickness of the first intermediate insulation layer.

3. The display panel of claim 1, wherein in the plan view, the first intermediate insulation layer overlaps the transmission region.

4. The display panel of claim 1, wherein:

the circuit layer further comprises a second intermediate insulation layer disposed between the base layer and the first intermediate insulation layer; and the compensation layer comprises a same material as a material of the second intermediate insulation layer, and is spaced apart from the second intermediate insulation layer and disposed in a same layer as the second intermediate insulation layer.

5. The display panel of claim 4, wherein a thickness of the compensation layer is substantially the same as a thickness of the second intermediate insulation layer.

6. The display panel of claim 1, wherein:

the circuit layer further comprises a third intermediate insulation layer disposed between the base layer and the first intermediate insulation layer; and the compensation layer comprises a same material as a material of the third intermediate insulation layer, and is disposed between the first intermediate insulation layer and the third intermediate insulation layer.

7. The display panel of claim 6, wherein a thickness of the compensation layer is substantially the same as a thickness of the third intermediate insulation layer.

8. The display panel of claim 1, wherein the first spacer is in contact with the circuit layer.

9. The display panel of claim 1, wherein the compensation layer does not overlap at least a portion of the transmission region in the plan view.

10. The display panel of claim 1, wherein the light emission element layer further comprises a pixel definition pattern which exposes at least a portion of the first electrode, wherein the pixel definition pattern overlaps the element region in the plan view.

11. The display panel of claim 10, wherein the display panel further comprises a second spacer disposed on the pixel definition pattern, wherein a thickness of the second spacer is less than a thickness of the first spacer.

12. A display panel comprising:

a base layer including a first region;

a circuit layer including a first intermediate insulation layer disposed on the base layer and a compensation layer disposed on the base layer;

a light emission element layer including a first light emission element having a first electrode and disposed in the first region, and disposed on the circuit layer; and a first spacer disposed on the circuit layer, and overlapping the compensation layer in a plan view, wherein:

the first region includes an element region overlapping the first electrode and a transmission region not overlapping the first electrode; and the first spacer and the compensation layer are each disposed in the transmission region, wherein:

the base layer further comprises a second region adjacent to the first region;

the light emission element layer further comprises a second light emission element including a second light emission layer and disposed in the second region; and the circuit layer further comprises a first pixel circuit electrically connected to the first light emission element and a second pixel circuit electrically connected to the second light emission element, wherein the first pixel circuit and the second pixel circuit are disposed in the second region.

13. The display panel of claim 12, wherein:

the base layer further comprises a third region adjacent to the second region;

the light emission element layer further comprises a third light emission element including a third light emission layer and disposed in the third region; and the circuit layer further comprises a third pixel circuit electrically connected to the third light emission element and disposed in the third region.

14. The display panel of claim 13, wherein the light emission element layer further comprises a pixel definition film surrounding the third light emission layer, wherein:

a third spacer is disposed on the pixel definition film; and a maximum height of the third spacer from the base layer is greater than a maximum height of the first spacer from the base layer.

15. The display panel of claim 13, wherein a thickness of the first intermediate insulation layer is constant in the second region and in the third region.

* * * * *